(12) United States Patent
Shang et al.

(10) Patent No.: US 12,279,494 B2
(45) Date of Patent: Apr. 15, 2025

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Haigang Qing, Beijing (CN); Lulu Yang, Beijing (CN); Zhengwei Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 26 days.

(21) Appl. No.: 17/769,332

(22) PCT Filed: May 13, 2021

(86) PCT No.: PCT/CN2021/093555
§ 371 (c)(1),
(2) Date: Apr. 14, 2022

(87) PCT Pub. No.: WO2022/001405
PCT Pub. Date: Jan. 6, 2022

(65) Prior Publication Data
US 2024/0130175 A1    Apr. 18, 2024

(30) Foreign Application Priority Data
Jun. 29, 2020 (CN) .......................... 202010615474.2

(51) Int. Cl.
*H01L 51/52* (2006.01)
*H01L 51/56* (2006.01)
(Continued)

(52) U.S. Cl.
CPC ....... *H10K 59/131* (2023.02); *H10K 59/1201* (2023.02); *H10K 59/873* (2023.02)

(58) Field of Classification Search
CPC ............. H10K 59/131; H10K 59/1201; H10K 59/873; H10K 59/12; H10K 50/84;
(Continued)

(56) References Cited

U.S. PATENT DOCUMENTS 10,998,391 B2 * 5/2021 Bae ...................... H10K 59/122
11,133,362 B2 * 9/2021 Kim ..................... H10K 59/124
(Continued)

FOREIGN PATENT DOCUMENTS

CN    107887417 A    4/2018
CN    109524418 A    3/2019
(Continued)

OTHER PUBLICATIONS

International Search Report for PCT/CN2021/093555 Mailed Aug. 12, 2021.
(Continued)

*Primary Examiner* — Mary A Wilczewski
*Assistant Examiner* — Tsz K Chiu
(74) *Attorney, Agent, or Firm* — Ling Wu; Stephen Yang; Ling and Yang Intellectual Property

(57) ABSTRACT

Provided is a display substrate. A base substrate includes a display region (100), a binding region located on one side of the display region (100), and a first peripheral region (200) located between the display region and the binding region. The display region (100) comprises multiple display units. A power line (210, 220) is disposed in the first peripheral region (200) of the base substrate, and is electrically connected to the display units. An organic insulating layer is disposed on the side of the power line away from the base substrate. In the first peripheral region (200), the organic
(Continued)

insulating layer includes at least two organic grooves and an isolation dam (410, 420) disposed between every two adjacent organic grooves, and the organic grooves penetrate through the organic insulating layer.

18 Claims, 17 Drawing Sheets

(51) Int. Cl.
*H10K 59/12* (2023.01)
*H10K 59/131* (2023.01)
*H10K 59/80* (2023.01)

(58) Field of Classification Search
CPC .. H10K 71/00; H10K 50/8426; H10K 59/122; H10K 59/8722; H10K 50/8428; H10K 59/1213; H10K 59/88; H10K 59/8723; H01L 27/124
See application file for complete search history.

(56) References Cited

U.S. PATENT DOCUMENTS

| | | | | |
|---|---|---|---|---|
| 11,417,864 | B2* | 8/2022 | Choi | H10K 59/87 |
| 11,974,466 | B2* | 4/2024 | Bai | H10K 50/844 |
| 12,133,420 | B2* | 10/2024 | Oh | H10K 71/221 |
| 2006/0220550 | A1* | 10/2006 | Harada | H10K 50/8426 |
| | | | | 438/34 |
| 2007/0170860 | A1* | 7/2007 | Choi | C03C 17/40 |
| | | | | 313/504 |
| 2014/0065430 | A1* | 3/2014 | Yamazaki | H10K 59/873 |
| | | | | 445/25 |
| 2016/0118416 | A1* | 4/2016 | Yamazaki | H01L 27/1218 |
| | | | | 257/43 |
| 2016/0307971 | A1* | 10/2016 | Jeon | H01L 22/30 |
| 2017/0148856 | A1* | 5/2017 | Choi | H10K 59/873 |
| 2018/0097034 | A1 | 4/2018 | Lee et al. | |
| 2018/0124933 | A1* | 5/2018 | Park | H05K 13/04 |
| 2018/0226612 | A1 | 8/2018 | Choi et al. | |
| 2019/0088733 | A1 | 3/2019 | Cho et al. | |
| 2020/0067017 | A1 | 2/2020 | Seo et al. | |
| 2020/0161582 | A1* | 5/2020 | Choi | H10K 59/122 |
| 2020/0168683 | A1* | 5/2020 | Son | H10K 50/844 |
| 2020/0411615 | A1 | 12/2020 | Ding et al. | |

FOREIGN PATENT DOCUMENTS

| | | | | |
|---|---|---|---|---|
| CN | 110265579 A | | 9/2019 | |
| CN | 110858630 A | * | 3/2020 | G09F 9/33 |
| CN | 110993818 A | | 4/2020 | |
| CN | 113991039 A | * | 1/2022 | |
| EP | 3651002 A1 | | 5/2020 | |
| EP | 3657561 A1 | * | 5/2020 | G06F 3/0412 |

OTHER PUBLICATIONS

Office Action dated May 19, 2022 for Chinese Patent Application No. 202010615474.2 and English Translation.

* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Phase Entry of International Application No. PCT/CN2021/093555 having an international filing date of May 13, 2021, which claims the priority of Chinese Patent Application No. 202010615474.2, filed to the CNIPA on Jun. 29, 2020 and entitled "Display Substrate and Manufacturing Method Therefor, and Display Device". The above-identified applications are hereby incorporated by reference.

TECHNICAL FIELD

The present disclosure relates to, but is not limited to, the field of display technologies, and particularly to a display substrate, a method for manufacturing the display substrate, and a display device.

BACKGROUND

An Organic Light Emitting Diode (OLED) is an active light emitting display device, and has the advantages such as auto-luminescence, wide viewing angle, high contrast, low power consumption, and extremely high response speed. With continuous development of the display technology, a display device that uses an OLED as a light emitting device and uses a Thin Film Transistor (TFT) for signal control has become a mainstream product in the field of display at present.

SUMMARY

The following is a summary of subject matters described herein in detail. This summary is not intended to limit the scope of protective of claims.

The present disclosure provides a display substrate, a method for preparing a display substrate, and a display device.

In one aspect, the present disclosure provides a display substrate, including a base substrate, a power supply line, an organic insulating layer, and a metal protective structure. The base substrate includes a display region, a bonding region located on a side of the display region, and a first peripheral region located between the display region and the bonding region. The display region includes a plurality of display units. The power supply line is at least partially arranged in the first peripheral region of the base substrate, and electrically connected to the display units. The organic insulating layer is arranged on a side of the power supply line away from the base substrate. The organic insulating layer includes, in the first peripheral region, at least two organic grooves and an isolation dam arranged between two adjacent organic grooves, the organic grooves penetrating the organic insulating layer. The power supply line and orthographic projections of the organic grooves on the base substrate have an overlapping region. The metal protective structure is arranged on a side of the power supply line away from the base substrate, and covers at least one edge of the overlapping region of the power supply line that is intersected with a first direction. The first direction refers to an extension direction parallel to an edge on a side of the display region close to the first peripheral region.

In another aspect, the present disclosure provides a display device, including the above-mentioned display substrate.

In another aspect, the present disclosure provides a method for preparing a display substrate, including: providing an base substrate, the base substrate including a display region, a bonding region located on a side of the display region, and a first peripheral region located between the display region and the bonding region; forming a power supply line in the first peripheral region, the power supply line being electrically connected to a display unit of the display region; and forming an organic insulating layer and a metal protective structure on a side of the power supply line away from the base substrate. The organic insulating layer includes, in the first peripheral region, at least two organic grooves and an isolation dam arranged between two adjacent organic grooves, and the organic grooves penetrate the organic insulating layer. The power supply line and orthographic projections of the organic grooves on the base substrate have an overlapping region. The metal protective structure covers at least one edge of the overlapping region of the power supply line that is intersected with a first direction, the first direction referring to an extension direction parallel to an edge on a side of the display region close to the first peripheral region.

Other aspects may be understood upon reading and understanding of the accompanying drawings and the detailed description.

BRIEF DESCRIPTION OF DRAWINGS

The accompanying drawings are used to provide further understanding of technical solutions of the present disclosure, constitute a part of the specification, and are used to explain the technical solutions of the present disclosure together with the embodiments of the present disclosure, but do not constitute a limitation on the technical solutions of the present disclosure. Shapes and sizes of one or more components in the accompanying drawings do not reflect actual scales and are only intended to illustrate the contents of the present disclosure.

DETAILED DESCRIPTION

Figure 1:
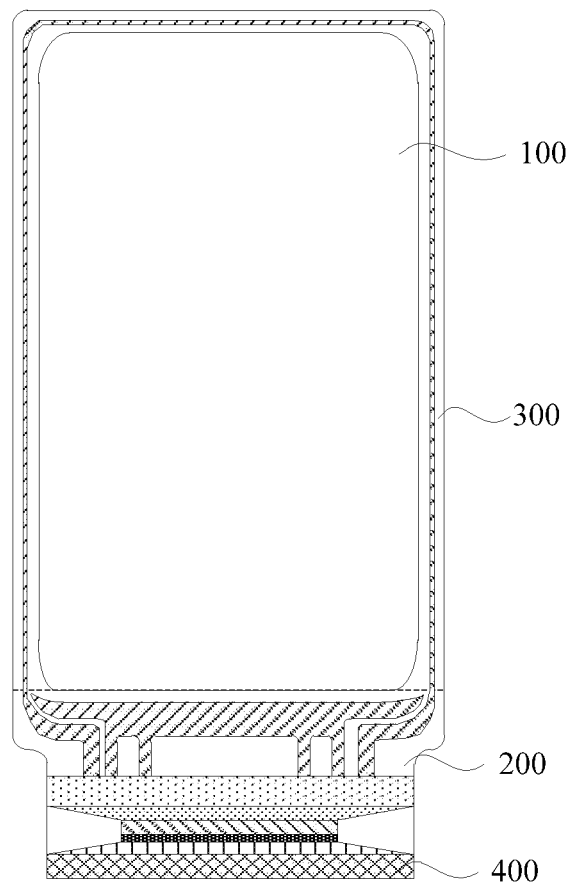
FIG. 1 is a schematic diagram of a structure of a display substrate according to at least one embodiment of the present disclosure.

Embodiments of the present disclosure will be described in detail below with reference to the accompanying drawings. Implementation modes may be implemented in a plurality of different forms. It will be readily appreciated by those of ordinary skill in the art that the implementation modes and contents may be changed into one or more forms without departing from the spirit and scope of the present disclosure. Therefore, the present disclosure should not be construed as only being limited to the contents recorded in the following embodiments. The embodiments in the present disclosure and features in the embodiments may be combined with each other randomly if there is no conflict.

In the accompanying drawings, a size of one or more constituent elements, and a thickness or an area of a layer is sometimes exaggerated for clarity. Therefore, a mode of the present disclosure is not always limited to the size, and the shape and size of each component in the drawings do not reflect the true scale. In addition, the accompanying drawings schematically show an ideal example, and one implementation mode of the present disclosure is not limited to the shape, value, or the like shown in the accompanying drawings.

Ordinal numerals "first", "second", and "third" in the present disclosure are set not to form limits in number but only to avoid the confusion of composition elements.

In the present disclosure, for convenience, wordings indicating orientations or positional relationships, such as "center", "upper", "lower", "front", "back", "vertical", "horizontal", "top", "bottom", "inside", "outside", and the like are used to describe the positional relationships of the constituent elements with reference to the accompanying drawings, and are merely for facilitating describing the present specification and simplifying the description, rather than indicating or implying that the referred apparatus or element must have a particular orientation, and be constructed and operated in the particular orientation. Thus, they cannot be construed as limitations on the present disclosure. The positional relationships between the constituent elements appropriately change according to directions according to which the constituent elements are described. Therefore, it is not limited to the wordings described in the specification, and can be replaced appropriately according to situations.

In the present disclosure, unless otherwise specified and defined explicitly, terms "mount", "mutually connect", "connect" and the like should be understood in a broad sense. For example, the term may be fixed connection, or detachable connection, or integral connection. The term may be mechanical connection or electric connection. The term may be direct connection, or indirect connection through an intermediate, or communication inside two elements. For those of ordinary skill in the art, meanings of the above-mentioned terms in the present disclosure can be understood according to situations.

In the present disclosure, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. In the present disclosure, the channel region refers to a main region that the current flows through.

Herein, a first electrode may be the drain electrode, and a second electrode may be the source electrode; or the first electrode may be the source electrode, and the second electrode may be the drain electrode. In the cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present disclosure.

In the present disclosure, "electrical connection" includes a situation where constituent elements are connected together by an element with certain electrical effect. There is no specific restriction on "the elements with the certain electrical effect" as long as electrical signals can be sent and received between the connected constituent elements. Examples of "the elements with certain electrical effect" not only includes electrodes or wirings, but also includes switch elements such as transistors, or other elements with one or more functions, such as resistors, inductors, capacitors, etc.

In the present disclosure, "parallel" refers to a state in which an angle formed by two straight lines is above −10° and below 10°. Therefore, it may include the state in which the angle is above −5° and below 5°. In addition, "perpendicular" refers to a state in which an angle formed by two straight lines is above 80° and below 100°, and thus also includes a state in which the angle is above 85° and below 95°.

In the present disclosure, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

A display device includes: a driving circuit layer arranged on a base substrate, a light emitting element arranged on the driving circuit layer, and an encapsulation layer arranged on the light emitting element, the encapsulation layer being used for protecting the light emitting element. Studies have shown that an encapsulation effect of the encapsulation layer has a great influence on display performances of the display device. If the encapsulation layer is invalid in encapsulation, for example, has a crack or is broken, vapor in the atmosphere will enter the light emitting device along the crack, causing an organic material in the light emitting device to be oxidized and invalid, thus forming an invalid region that cannot emit light. As vapor continuously intrudes the light emitting device along the crack, the invalid region gradually expands, resulting in poor display of the display device, which is referred to as Growing Dark Spot (GDS).

At least one embodiment of the present disclosure provides a display substrate, including a base substrate, a power supply line, an organic insulating layer, and a metal protective structure. The base substrate includes a display region, a bonding region located on a side of the display region, and a first peripheral region located between the display region and the bonding region. The display region includes a plurality of display units. The power supply line is at least partially arranged in the first peripheral region of the base substrate, and electrically connected to the display units. The organic insulating layer is arranged on a side of the power supply line away from the base substrate. The organic insulating layer includes, in the first peripheral region, at least two organic grooves and an isolation dam arranged between two adjacent organic grooves, the organic grooves penetrating the organic insulating layer. The power supply line and orthographic projections of the organic grooves on the base substrate have an overlapping region. The metal protective structure is arranged on a side of the power supply line away from the base substrate, and covers at least one edge of the overlapping region of the power supply line that is intersected with a first direction. The first direction refers to an extension direction parallel to an edge on a side of the display region close to the first peripheral region.

According to the display substrate provided in the embodiment, by using the metal protective structure to cover at least one edge of the overlapping region of the power supply line that is intersected with the first direction in the first peripheral region, a water and oxygen intrusion route that appears at a side edge of the power supply line can be blocked, thereby reducing the risk of occurrence of GDS, avoiding poor display of the display substrate, and improving the display quality.

In some exemplary implementation, the metal protective structure is in direct contact with the overlapping region of the power supply line, and covers the edge of the overlapping region of the power supply line that is intersected with the first direction.

In some exemplary implementation, an orthographic projection of the metal protective structure on the base substrate covers an orthographic projection of the overlapping region on the base substrate, and the metal protective structure is disconnected in an isolation dam. In the exemplary implementation, the metal protective structure is disconnected in the isolation dam, and formation of a communicated water and oxygen channel in the metal protective structure may be avoided, thereby reducing the risk of occurrence of GDS, avoiding poor display of the display substrate, and improving the display quality.

In some exemplary implementation, a distance between the edge of the overlapping region of the power supply line that is intersected with the first direction and covered with the metal protective structure and an edge of an adjacent metal protective structure ranges from 5 microns (μm) to 15 microns (μm), for example, the distance between the two may be 15 μm. In some examples, along the first direction, a length of the metal protective structure is greater than a length of the power supply line covered with the metal protective structure, so that the edge of the power supply line is covered to prevent water and oxygen from entering the display region from the side edge of the power supply line.

In some exemplary implementation, the isolation dam includes a first isolation dam and a second isolation dam, and a distance between the first isolation dam and an edge on a side of the display region close to the first peripheral region is less than a distance between the second isolation dam and an edge on a side of the display region close to the first peripheral region. The metal protective structure is disconnected in the first isolation dam, or is disconnected in the second isolation dam, or is disconnected in both the first isolation dam and the second isolation dam. In the exemplary implementation, with an arrangement that the metal protective structure is disconnected in the isolation dam, the formation of the communicated water and oxygen channel in the metal protective structure may be avoided.

In some exemplary implementation, the power supply line includes a first power supply line and a second power supply line. The first power supply line and orthographic projections of the organic grooves on the base substrate have a first overlapping region; and the second power supply line and orthographic projections of the organic grooves on the base substrate have a second overlapping region. The metal protective structure includes: a first metal protective structure and a second metal protective structure. The first metal protective structure covers at least one edge of the first overlapping region of the first power supply line that is intersected with the first direction. The second metal protective structure covers at least one edge of the second overlapping region of the second power supply line that is intersected with the first direction. The first metal protective structure is disconnected in the first isolation dam, or is disconnected in the second isolation dam, or is disconnected in both the first isolation dam and the second isolation dam. The second metal protective structure is disconnected in the first isolation dam, or is disconnected in the second isolation dam, or is disconnected in both the first isolation dam and the second isolation dam. In the exemplary implementation, the first power supply line is a high-voltage power supply line, and the second power supply line is a low-voltage power supply line. The first metal protective structure and the second metal protective structure are discontinuous, which can avoid affecting signal transmission of the first power supply line and the second power supply line. In some examples, the first metal protective structure is disconnected in the first isolation dam and the second isolation dam, and the second metal protective structure is disconnected in the first isolation dam and the second isolation dam. However, no limits are made thereto in the present embodiment. In some examples, the first metal protective structure is disconnected in the first isolation dam and the second metal protective structure is disconnected in the first isolation dam or the second isolation dam, or, the first metal protective structure is disconnected in the second isolation dam and the second metal protective structure is disconnected in the first isolation dam or the second isolation dam.

In some exemplary implementation modes, the first power supply line includes a first strip portion and a second strip portion. The first strip portion extends along the first direction, and the second strip portion extends in a direction away from the display region. An end of the second strip portion close to the display region is connected to the first strip portion. The first isolation dam, the second isolation dam, and the first metal protective structure are all arranged on a side of the second strip portion of the first power supply line away from the base substrate.

In some exemplary implementation modes, the first metal protective structure includes: a first metal protective block, a second metal protective block, and a third metal protective block that are sequentially arranged along a direction away from the display region. The first metal protective block is located on a side of the first isolation dam close to the display region, the second metal protective block is located between the first isolation dam and the second isolation dam, and the third metal protective block is located on a side of the second isolation dam away from the display region. Both the first metal protective block and the second metal protective block are overlapped with the first isolation dam, and there is an interval between adjacent edges of the first metal protective block and the second metal protective block. Both the second metal protective block and the third metal protective block are overlapped with the second isolation dam, and there is an interval between adjacent edges of the second metal protective block and the third metal protective block.

In some exemplary implementation, the first metal protective structure includes: a first metal protective block and a second metal protective block that are sequentially arranged along a direction away from the display region. The first metal protective block is located on a side of the first isolation dam close to the display region, and the second metal protective block is located on a side of the first isolation dam away from the display region. Both the first metal protective block and the second metal protective block are overlapped with the first isolation dam, and there is an interval between adjacent edges of the first metal protective block and the second metal protective block.

In some exemplary implementation modes, the first metal protective structure includes: a first metal protective block and a second metal protective block that are sequentially arranged along a direction away from the display region. The first metal protective block is located on a side of the second isolation dam close to the display region, and the second metal protective block is located on a side of the second isolation dam away from the display region. Both the first metal protective block and the second metal protective block are overlapped with the second isolation dam, and there is an interval between adjacent edges of the first metal protective block and the second metal protective block.

In some exemplary implementation, the base substrate further includes: a second peripheral region located on the periphery of the display region and on a side away from the bonding region. The first peripheral region and the second peripheral region are communicated to surround the display region. The second power supply line extends from the first peripheral region to the second peripheral region. The second peripheral region includes a power supply connection line arranged on a side of the second power supply line away from the base substrate. The second power supply line in the second peripheral region is electrically connected to the display units in the display region through the power supply connection line. The second metal protective structure and the power supply connection line are arranged in the same layer and spaced apart, or the second metal protective structure includes at least two metal protective blocks, wherein one metal protective block is integrated with the power supply connection line, and is arranged in the same layer as the rest of the metal protective blocks and spaced apart from them. In some examples, the metal protective blocks of the second metal protective structure are disconnected from the power supply connection line at a corner of the second power supply line, that is, an interval between the metal protective blocks of the second metal protective structure and the power supply connection line may be set at the corner of the second power supply line. However, no limits are made thereto in the present embodiment. For example, a connection between the metal protective blocks of the second metal protective structure and the power supply connection line is broken at a junction of the first peripheral region and the second peripheral region. In the exemplary implementation, the second metal protective structure is disconnected or partially disconnected from the power supply connection line in the second peripheral region, so that water and oxygen can be prevented from bypassing into the inside of the display region via the power supply connection line through the second metal protective structure.

In some exemplary implementation, the second power supply line in the first peripheral region includes: a third strip portion and a fourth strip portion. The third strip portion substantially extends along the first direction, and has a corner. The fourth strip portion extends in a direction away from the display region. An end of the fourth strip portion close to the display region is connected to the third strip portion. The first isolation dam, the second isolation dam, and the second metal protective structure are all arranged on a side of the third strip portion of the second power supply line away from the base substrate. In the exemplary implementation, because the third strip portion has the corner, an extension direction of the third strip portion is not completely consistent with the first direction, for example, there may be a difference at the corner.

In some exemplary implementation, the second metal protective structure includes: a fourth metal protective block, a fifth metal protective block, and a sixth metal protective block that are sequentially arranged along a direction away from the display region. The fourth metal protective block is located on a side of the first isolation dam close to the display region, and includes a first extension portion and a second extension portion. Both the first extension portion and the second extension portion substantially extend along the first direction, and an end of the first extension portion close to the corner of the third strip portion of the second power supply line is connected to the second extension portion. In a vertical direction of the first direction, an average width of the first extension portion is less than an average width of the second extension portion. The fifth metal protective block and the first extension portion of the fourth metal protective block are disconnected in the first isolation dam, and the fifth metal protective block and the second extension portion of the fourth metal protective block are disconnected at the corner of the third strip portion. The sixth metal protective block and the fifth metal protective block are disconnected in the second isolation dam, and the sixth metal protective block and the second extension portion of the fourth metal protective block are disconnected at the corner of the third strip portion.

In some exemplary implementation, the second metal protective structure includes: a fourth metal protective block and a fifth metal protective block that are sequentially arranged along a direction away from the display region. The fourth metal protective block includes a first extension portion and a second extension portion, the first extension portion and the second extension portion substantially extending along the first direction. An end of the first extension portion close to the corner of the third strip portion of the second power supply line is connected to the second extension portion. In a vertical direction of the first direction, an average width of the first extension portion is less than an average width of the second extension portion. The fourth metal protective block is located on a side of the first isolation dam close to the display region, the fifth metal protective block and the first extension portion of the fourth metal protective block are disconnected in the first isolation dam, and the fifth metal protective block and the second extension portion of the fourth metal protective block are disconnected at the corner of the third strip portion.

In some exemplary implementation, the second metal protective structure includes: a fourth metal protective block and a fifth metal protective block that are sequentially arranged along a direction away from the display region. The fourth metal protective block includes a first extension portion and a second extension portion, the first extension portion and the second extension portion substantially extending along the first direction. An end of the first extension portion close to the corner of the third strip portion of the second power supply line is connected to the second extension portion. In a vertical direction of the first direction, an average width of the first extension portion is less than an average width of the second extension portion. The fourth metal protective block is located on a side of the second isolation dam close to the display region, the fifth metal protective block and the first extension portion of the fourth metal protective block are disconnected in the second isolation dam, and the fifth metal protective block and the second extension portion of the fourth metal protective block are disconnected at the corner of the third strip portion.

In some exemplary implementation, the organic insulating layer includes: a first organic insulating layer and a second organic insulating layer. The first organic insulating layer is arranged on a side of the power supply line away from the base substrate. The second organic insulating layer is arranged on a side of the metal protective structure away from the base substrate, the second organic insulating layer covering an edge of the metal protective structure.

In some exemplary implementation, the display region includes: a driving structure layer, a metal conductive layer arranged on the driving structure layer, a light emitting element arranged on the metal conductive layer, and a composite encapsulation layer arranged on the light emitting element, the light emitting element being connected to the driving structure layer through the metal conductive layer. The driving structure layer includes: an active layer, a first gate metal layer, a second gate metal layer, and a source-drain electrode layer that are arranged on the base substrate and insulated from one another. The power supply line and the source-drain electrode layer are arranged in the same layer, and the metal protective structure and the metal conductive layer are arranged in the same layer.

In some exemplary implementation, the display substrate further includes: a composite insulating layer arranged on a side of the power supply line close to the base substrate. The composite insulating layer includes: a first insulating layer, a second insulating layer, a third insulating layer, and a fourth insulating layer, and the first insulating layer to fourth insulating layer are all inorganic insulating layers.

FIG. 1 is a schematic diagram of a structure of a display substrate according to at least one embodiment of the present disclosure. As shown in FIG. 1, the display substrate provided in the embodiment includes: a display region 100 and a non-display region located around the display region 100. The non-display region includes a bonding region 400 located on a side of the display region 100, a first peripheral region 200 located between the display region 100 and the bonding region 400, and a second peripheral region 300 located on the periphery of the display region 100 and on a side away from the bonding region 400. The first peripheral region 200 and the second peripheral region 300 are communicated to surround the display region 100. The display region 100 at least includes a plurality of display units. In some examples, a pixel includes three display units, i.e., a red display unit, a green display unit, and a blue display unit. However, no limits are made thereto in the present embodiment. In some examples, a pixel includes four display units, for example, a red display unit, a green display unit, a blue display unit, and a white display unit, respectively. The first peripheral region 200 at least includes: an isolation dam, and a power supply line for transmitting voltage signals to the plurality of display units. The bonding region 400 includes a circuit for connecting the signal lines of the plurality of display units to an external driving device. The second peripheral region 300 at least includes: an isolation dam and a power supply line for transmitting voltage signals to the plurality of display units. The isolation dams of the first peripheral region 200 and the second peripheral region 300 may form an annular structure surrounding the display region 100.

Figure 2:
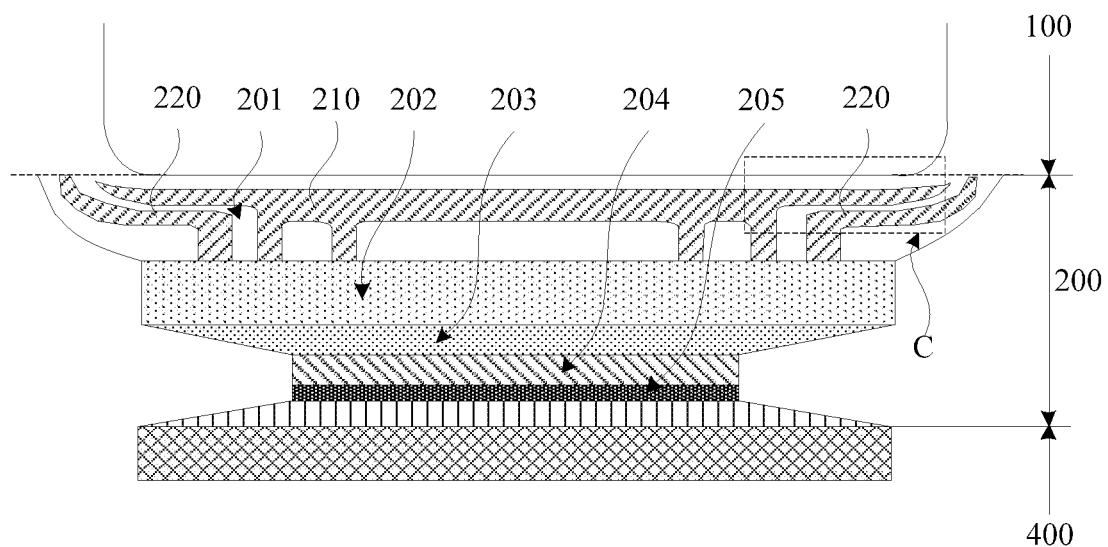
FIG. 2 is a schematic diagram of a structure of a first peripheral region of a display substrate according to at least one embodiment of the present disclosure.

FIG. 2 is a schematic diagram of a structure of a first peripheral region of a display substrate according to at least one embodiment of the present disclosure. As shown in FIG. 2, in a plane parallel to the display substrate, the first peripheral region 200 is located between the display region 100 and the bonding region 400. The first peripheral region 200 may include a first fanout area 201, a bending area 202, a second fanout area 203, an anti-static area 204, and a driver chip area 205 that are arranged in sequence along a direction away from the display region 100.

In at least one exemplary embodiment, as shown in FIG. 2, the first fanout area 201 contains: a data fanout line (not shown in the figure), a first power supply line 210, and a second power supply line 220. The data fanout line is located on a side of the first power supply line 210 and second power supply line 220 close to the base substrate. The data fanout line includes a plurality of data connection lines. The plurality of data connection lines are configured to be connected to Data Lines of the display region 100 in a Fanout wiring manner. The first power supply line 210 is located in a middle region of the first fanout area 201, and is configured to be connected to a high-voltage power supply line (VDD) in the display region 100. The second power supply line 220 is located on two sides of the first power supply line 210 and is configured to be connected to a low-voltage power supply line (VSS) in the second peripheral region 300.

In at least one exemplary embodiment, as shown in FIG. 2, the bending area 202 includes a composite insulating layer provided with a groove, and is configured to bend the bonding region 400 to a back surface of the display region 100. The second fanout area 203 includes a plurality of data connection lines that are led out in a fanout wiring manner. The anti-static area 204 includes an anti-static circuit, and is arranged for removing static electricity to prevent the display substrate from electrostatic damages. The driver chip area 205 includes an Integrated Circuit (IC) and is arranged to be connected to the plurality of data connection lines. The bonding pin area 400 includes a plurality of Bonding Pads, and is arranged to be bonded to an external Flexible Printed Circuit (FPC).

Figure 3:
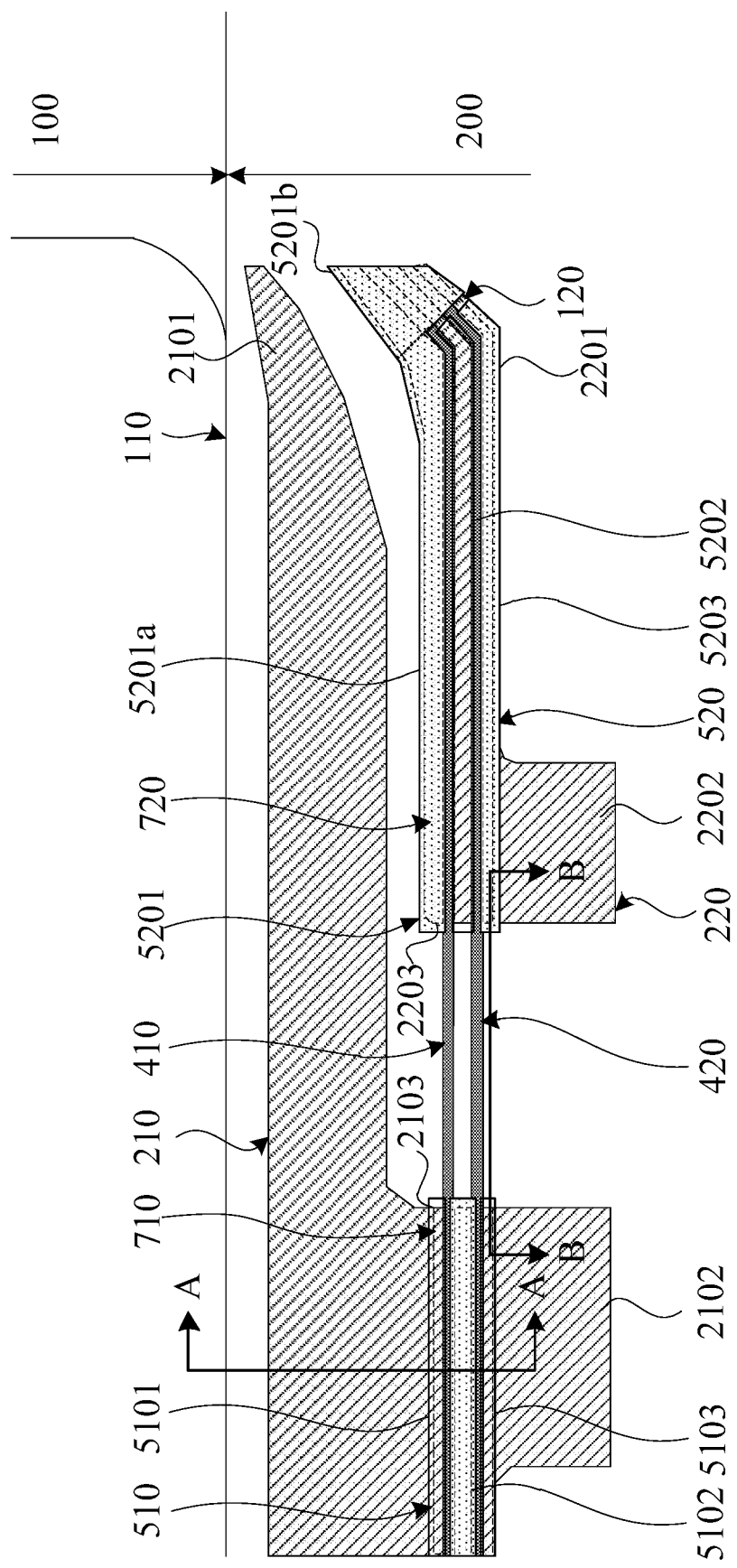
FIG. 3 is a schematic diagram of a structure of a first fanout area according to at least one embodiment of the present disclosure.
Figure 4:
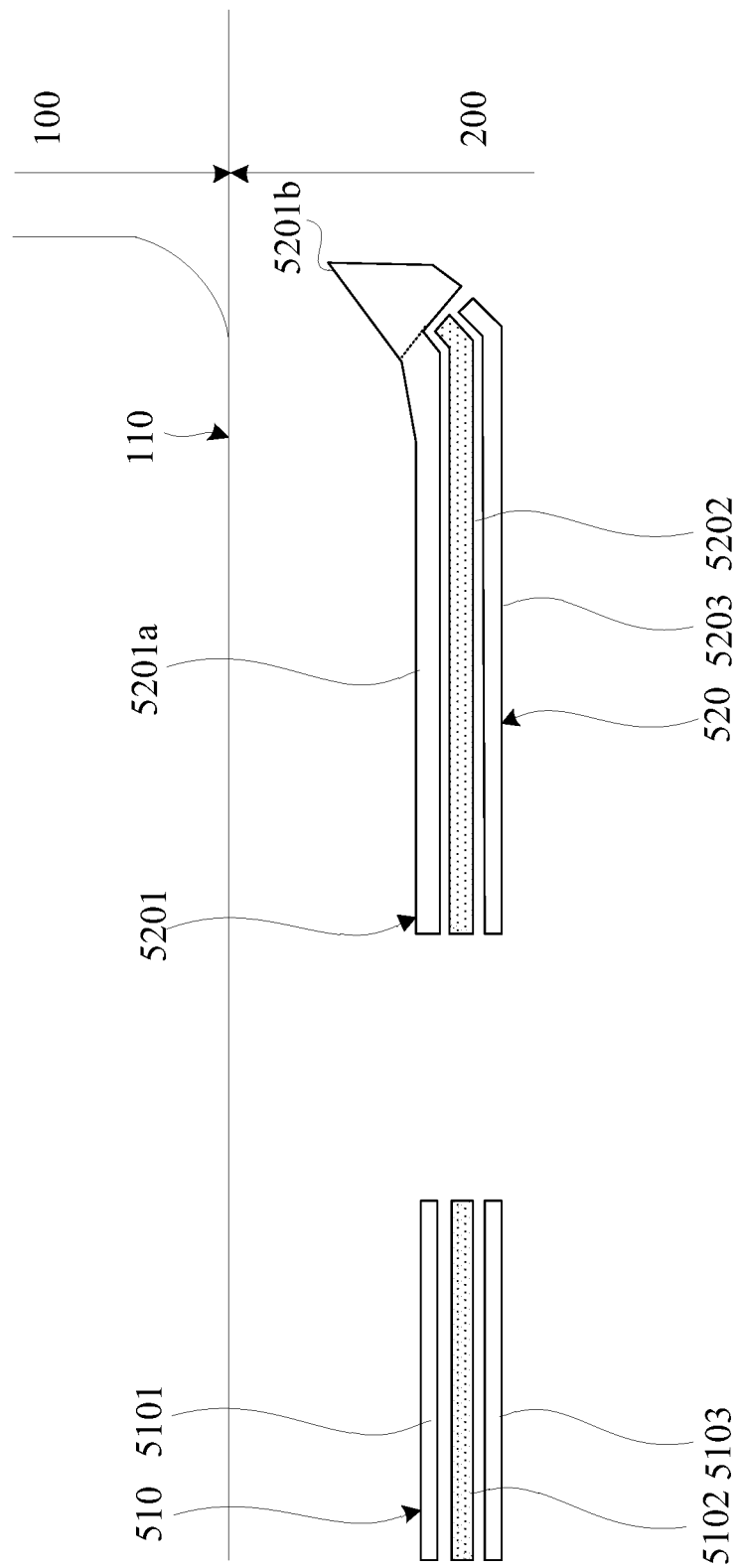
FIG. 4 is a top view of a metal protective structure in FIG. 3.
Figure 5:
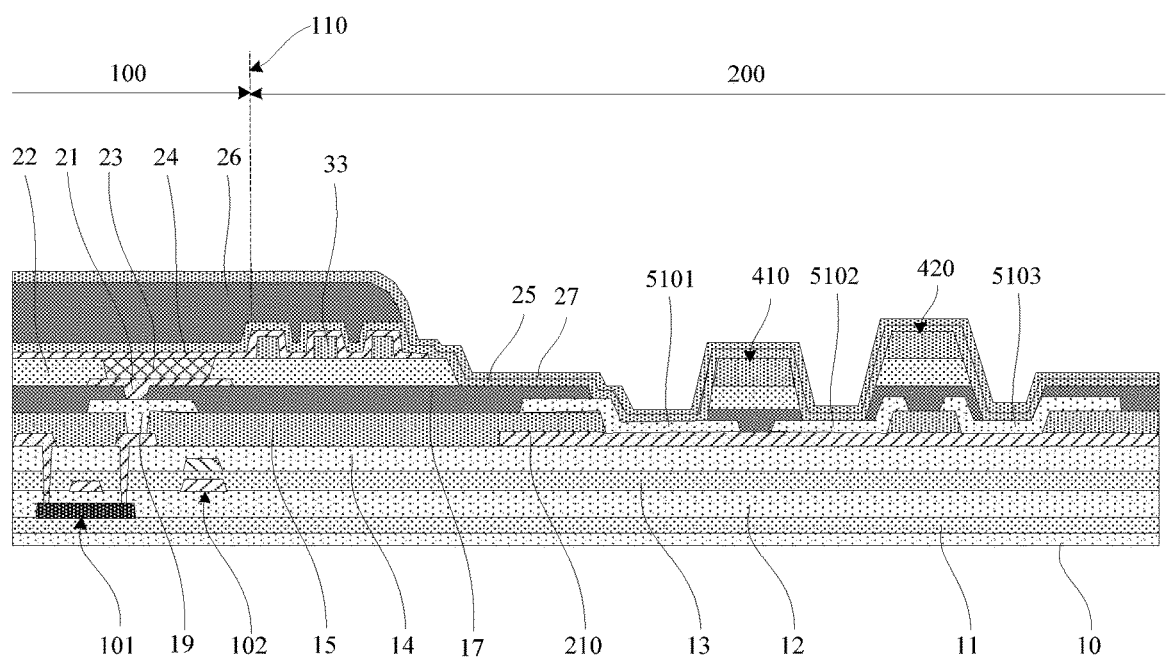
FIG. 5 is a schematic sectional view along a direction A-A in FIG. 3.
Figure 6:
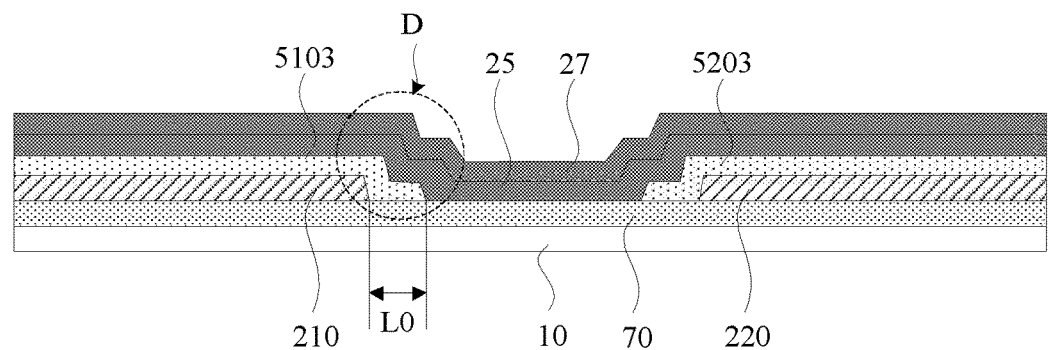
FIG. 6 is a schematic sectional view along a direction B-B in FIG. 3.

FIG. 3 is a schematic diagram of a structure of a first fanout area according to at least one embodiment of the present disclosure. FIG. 3 is an enlarged view of a region C in FIG. 2. FIG. 4 is a top view of a metal protective structure in FIG. 3. FIG. 5 is a schematic sectional view along a direction A-A in FIG. 3. FIG. 6 is a schematic sectional view along a direction B-B in FIG. 3.

In at least one exemplary embodiment, as shown in FIG. 3, in a plane parallel to the display substrate, the display substrate includes the display region 100 and the first peripheral region 200. The first peripheral region 200 is located between the display region 100 and the bonding region, and the first fanout area of the first peripheral region 200 is close to an edge 110 of the display region. The first fanout area includes: the first power supply line 210, the second power supply line 220, and the data fanout line (not shown). The first power supply line 210 is connected to the high-voltage power supply line in the display region 100, and is arranged to transmit high-voltage signals to the plurality of display units in the display region 100. The second power supply 220 is connected to the low-voltage power supply line in the second peripheral region 300, and is arranged to transmit low-voltage signals to the plurality of display units in the display region 100.

In at least one exemplary embodiment, as shown in FIG. 3 and FIG. 4, the first fanout area further includes: a first isolation dam 410, a second isolation dam 420, a first metal protective structure 510, and a second metal protective structure 520, and is arranged to block vapor from entering the display region 100. The first isolation dam 410 and the second isolation dam 420 are arranged in the first peripheral region 200 and the second peripheral region 300, and form an annular structure in the first peripheral region 200 and the second peripheral region 300 to surround the display region 100. The first isolation dam 410 and the second isolation dam 420 are arranged to block vapor from entering the display region 100 from the periphery of the display region 100. In the first peripheral region 200, the first isolation dam 410 and the second isolation dam 420 may extend along a first direction. The first direction refers to an extension direction parallel to an edge on a side of the display region 100 close to the first peripheral region 200. That is, the first direction refers to an extension direction parallel to the edge 110 of the display region. A distance between the first isolation dam 410 and the edge 110 of the display region is less than a distance between the second isolation dam 420 and the edge 110 of the display region, that is, the second isolation dam 420 is arranged on a side of the first isolation dam 410 away from the display region 100.

In the present disclosure, "length" refers to a feature size along an extension direction (i.e., the first direction) parallel to the edge of the display region. "Width" refers to a feature size along the vertical direction of the first direction.

In at least one exemplary embodiment, as shown in FIG. 3 and FIG. 4, a first metal protective structure 510 is arranged in the first peripheral region 200 and is arranged to block vapor from entering the display region 100 along an edge 2103 of the first power supply line 210. The first metal protective structure 510 is in direct contact with part of the first power supply line 210 that is exposed by the organic grooves of the organic insulating layer. The first metal protective structure 510 includes: a first metal protective block 5101, a second metal protective block 5102, and a third metal protective block 5103. The first metal protective block 5101, the second metal protective block 5102, and the third metal protective block 5103 are sequentially arranged in a direction away from the display region 100. The first metal protective block 5101, the second metal protective block 5102, and the third metal protective block 5103 respectively extend along the first direction. The first metal protective block 5101, the second metal protective block 5102, and the third metal protective block 5103 are all rectangles, for example, are rounded rectangles. Along the first direction, the first metal protective block 5101, the second metal protective block 5102, and the third metal protective block 5103 respectively cover the side edge 2103 of the first power supply line 210 exposed by the organic grooves of the organic insulating layer. For example, along a direction parallel to the edge 110 of the display region, a length of any metal protective block is greater than a length of the first power supply line 210 covered with it. In this embodiment, shapes of the metal protective blocks included in the first metal protective structure are not limited, as long as the metal protective blocks can cover the edge of the first power supply line exposed by the organic grooves of the organic insulating layer in a direction parallel to the edge of the display region. In some examples, each metal protective block in the exemplary embodiment is divided into two or more metal protective blocks to form a regularly arranged array of metal protective blocks, and covers the side edge of the first power supply line 210 exposed by the organic grooves of the organic insulating layer in a direction parallel to the edge of the display region.

In at least one exemplary embodiment, as shown in FIG. 3 and FIG. 4, both the first metal protective block 5101 and the second metal protective block 5102 are overlapped with the first isolation dam 410, and there is an interval between adjacent edges of the first metal protective block 5101 and the second metal protective block 5102. Both the second metal protective block 5102 and the third metal protective block 5103 are overlapped with the second isolation dam 420, and there is an interval between adjacent edges of the second metal protective block 5102 and the third metal protective block 5103.

In at least one exemplary embodiment, as shown in FIG. 3 and FIG. 4, the first metal protective structure 5101 is located on a side of the first isolation dam 410 close to the display region 100. In the direction away from the display region 100, a distance between an edge of the first metal protective block 5101 close to the display region 100 and the edge 110 of the display region is less than a distance between an edge of the first isolation dam 410 close to the display region 100 and the edge 110 of the display region; a distance between an edge of the first metal protective block 5101 away from the display region 100 and the edge 110 of the display region is greater than a distance between an edge of the first isolation dam 410 close to the display region 100 and the edge 110 of the display region, and is less than a distance between an edge of the first isolation dam 410 away from the display region 100 and the edge 110 of the display region. That is, the first metal protective block 5101 and the first isolation dam 410 have an overlapping region, and the edge of the first metal protective block 5101 away from the display region 100 is located in the first isolation dam 410.

In at least one exemplary embodiment, as shown in FIG. 3 and FIG. 4, the second metal protective structure 5102 is located between the first isolation dam 410 and the second isolation dam 420. The first metal protective block 5101 and the second metal protective block 5102 are disconnected in the first isolation dam 410. In the direction away from the display region 100, a distance between an edge of the second metal protective block 5102 close to the display region 100 and the edge 110 of the display region is less than a distance between an edge of the first isolation dam 410 away from the display region 100 and the edge 110 of the display region, and is greater than a distance between an edge of the first isolation dam 410 close to the display region 100 and the edge 110 of the display region. A distance between an edge of the second metal protective block 5102 away from the display region 100 and the edge 110 of the display region is greater than a distance between an edge of the second isolation dam 420 close to the display region 100 and the edge 110 of the display region, and is less than a distance between an edge of the second isolation dam 420 away from the display region 100 and the edge 110 of the display region. A width of the second metal protective block 5102 is greater than a spacing between the first isolation dam 410 and the second isolation dam 420 along the direction away from the display region 100. That is, the second metal protective block 5102 respectively has an overlapping region with the first isolation dam 410 and the second isolation dam 420, the edge of the second metal protective block 5102 close to the display region 100 is located in the first isolation dam 410, and the edge of the second metal protective block 5102 away from the display region 100 is located in the second isolation dam 420.

In at least one exemplary embodiment, as shown in FIG. 3 and FIG. 4, the third metal protective structure 5103 is located on a side of the second isolation dam 420 away from the display region 100. The second metal protective block 5102 and the third metal protective block 5103 are disconnected in the second isolation dam 420. In the direction away from the display region 100, a distance between an edge of the third metal protective block 5103 close to the display region 100 and the edge 110 of the display region is less than a distance between the edge of the second isolation dam 420 away from the display region 100 and the edge 110 of the display region, and is greater than a distance between the edge of the second isolation dam 420 close to the display region 100 and the edge 110 of the display region. A distance between an edge of the third metal protective block 5103 away from the display region 100 and the edge 110 of the display region is greater than a distance between the edge of the second isolation dam 420 away from the display region 100 and the edge 110 of the display region. That is, the third metal protective block 5103 and the second isolation dam 420 have an overlapping region, and the edge of the third metal protective block 5103 close to the display region 100 is located in the second isolation dam 420.

In at least one exemplary embodiment, as shown in FIG. 3 and FIG. 4, the second metal protective structure 520 is arranged in the second peripheral region 200 and is arranged to block vapor from entering the display region 100 along an edge 2203 of the second power supply line 220. The second metal protective structure 520 is in direct contact with part of the second power supply line 220 that is exposed by the organic grooves of the organic insulating layer. The second metal protective structure 520 includes: a fourth metal protective block 5201, a fifth metal protective block 5202, and a sixth metal protective block 5203. The fourth metal protective block 5201, the fifth metal protective block 5202, and the sixth metal protective block 5203 are sequentially arranged in a direction away from the display region 100. The fourth metal protective block 5201, the fifth metal protective block 5202, and the sixth metal protective block 5203 respectively substantially extend along the first direction, and respectively cover the side edge 2203 of the second power supply line 220 exposed by the organic grooves of the organic insulating layer.

In at least one exemplary embodiment, as shown in FIG. 3 and FIG. 4, the fourth metal protective structure 5201 includes: a first extension portion 5201a and a second extension portion 5201b. The first extension portion 5201a and the second extension portion 5201b substantially extend along the first direction. An end of the first extension portion 5201a adjacent to the corner of the edge 110 of the display region may be connected to the second extension part 5201b. In a vertical direction of the first direction, an average width of the first extension portion 5201a is less than an average width of the second extension portion 5201b. The first extension portion 5201a is located on a side of the first isolation dam 410 close to the display region 100. In the direction away from the display region 100, a distance between an edge of the first extension portion 5201a close to the display region 100 and the edge 110 of the display region is less than a distance between an edge of the second power supply line 220 close to the display region 100 and the edge 110 of the display region, and is less than a distance between the edge of the first isolation dam 410 close to the display region 100 and the edge 110 of the display region. A distance between an edge of the first extension portion 5201a away from the display region 100 and the edge 110 of the display region is greater than a distance between the edge of the first isolation dam 410 close to the display region 100 and the edge 110 of the display region, and is less than a distance between the edge of the first isolation dam 410 away from the display region 100 and the edge 110 of the display region. A distance between an edge of the second extension portion 5201b close to the display region 100 and the edge 110 of the display region is less than a distance between an edge of the second power supply line 220 close to the display region 100 and the edge 110 of the display region. A distance between an edge of the second extension portion 5201b away from the display region 100 and the edge 110 of the display region is greater than or equal to a distance between an edge of the second power supply line 220 away from the display region 100 and the edge 110 of the display region. In some examples, a distance between an edge of the first extension portion 5201a close to the display region 100 and the edge 110 of the display region is greater than or equal to a distance between the edge of the second power supply line 220 close to the display region 100 and the edge 110 of the display region, and is less than a distance between the edge of the first isolation dam 410 close to the display region 100 and the edge 110 of the display region. No limits are made thereto in the present embodiment.

In some examples, the second peripheral region 300 includes a power supply connection line arranged on a side of the second power supply line 220 away from the base substrate. The second power supply line in the second peripheral region 300 is electrically connected to the display units in the display region 100 through the power supply connection line. The power supply connection line and the second metal protective structure 520 are arranged in the same layer and spaced apart. For example, an interval between the second extension portion 5201b of the fourth metal protective block 5201 and the power connection line in the second peripheral region 300 is set at a junction of the first peripheral region 200 and the second peripheral region 300.

In at least one exemplary embodiment, as shown in FIG. 3 and FIG. 4, the fifth metal protective block 5202 substantially extends along the first direction to the corner 120 of the second power supply line 220. The fifth metal protective block 5202 is located between the first isolation dam 410 and the second isolation dam 420. The fifth metal protective block 5202 and the first extension portion 5201a of the fourth metal protective block 5201 are disconnected in the first isolation dam 410, and the fifth metal protective block 5202 and the second extension 5201b of the fourth metal protective block 5201 are disconnected at the corner 120 of the second power supply line 220. For example, the fifth metal protective block 5202 and the first extension portion 5201a of the fourth metal protective block 5201 both are overlapped with the first isolation dam 410, and there is an interval between adjacent edges of the fifth metal protective block 5202 and the first extension portion 5201a of the fourth metal protective block 5201; there is an interval between adjacent edges of the fifth metal protective block 5202 and the second extension portion 5201b of the fourth metal protective block 5201, and the interval is located at the corner 120 of the second power supply line 220.

In some examples, in the direction away from the display region 100, a distance between an edge of the fifth metal protective block 5202 close to the display region 100 and the edge 110 of the display region is less than a distance between the edge of the first isolation dam 410 away from the display region 100 and the edge 110 of the display region, and is greater than a distance between the edge of the first isolation dam 410 close to the display region 100 and the edge 110 of the display region. A distance between an edge of the fifth metal protective block 5202 away from the display region 100 and the edge 110 of the display region is greater than a distance between the edge of the second isolation dam 420 close to the display region 100 and the edge 110 of the display region, and is less than a distance between the edge of the second isolation dam 420 away from the display region 100 and the edge 110 of the display region. A width of the fifth metal protective block 5202 is greater than a spacing between the first isolation dam 410 and the second isolation dam 420 along the direction away from the display region 100. That is, the fifth metal protective block 5202 respectively has an overlapping region with the first isolation dam 410 and the second isolation dam 420, the edge of the fifth metal protective block 5202 close to the display region 100 is located in the first isolation dam 410, and the edge of the fifth metal protective block 5202 away from the display region 100 is located in the second isolation dam 420.

In at least one exemplary embodiment, as shown in FIG. 3 and FIG. 4, the sixth metal protective block 5203 substantially extends along the first direction to the corner 120 of the second power supply line 220. The sixth metal protective block 5203 is located on a side of the second isolation dam 420 away from the display region 100. The sixth metal protective block 5203 and the fifth metal protective block 5202 are disconnected in the second isolation dam 420, and the sixth metal protective block 5203 and the second extension portion 5201b of the fourth metal protective block 5201 are disconnected at the corner 120 of the second power supply line 220. For example, the sixth metal protective block 5203 and the fifth metal protective block 5202 are both overlapped with the second isolation dam 420, and there is an interval between adjacent edges of the sixth metal protective block 5203 and the fifth metal protective block 5202; there is an interval between adjacent edges of the sixth metal protective block 5203 and the second extension portion 5201b of the fourth metal protective block 5201, and the interval is disconnected at the corner 120 of the second power supply line 220.

In some examples, in the direction away from the display region 100, a distance between an edge of the sixth metal protective block 5203 close to the display region 100 and the edge 110 of the display region is less than a distance between the edge of the second isolation dam 420 away from the display region 100 and the edge 110 of the display region, and is greater than a distance between the edge of the second isolation dam 420 close to the display region 100 and the edge 110 of the display region. A distance between an edge of the sixth metal protective block 5203 away from the display region 100 and the edge 110 of the display region is greater than a distance between the edge of the second isolation dam 420 away from the display region 100 and the edge 110 of the display region. That is, the sixth metal protective block 5203 and the second isolation dam 420 have an overlapping region, and the edge of the sixth metal protective block 5203 close to the display region 100 is located in the second isolation dam 420. In some examples, a distance between an edge of the sixth metal protective block 5203 away from the display region 100 and the edge 110 of the display region is less than or equal to a distance between the edge of the second power supply line 220 away from the display region 100 and the edge 110 of the display region, or, is greater than a distance between the edge of the second power supply line 220 away from the display region 100 and the edge 110 of the display region. No limits are made thereto in the present embodiment.

In at least one exemplary embodiment, as shown in FIG. 2 and FIG. 3, the first power supply line 210 includes: a first strip portion 2101 and a second strip portion 2102. The first strip portion 2101 extends along the first direction, and the second strip portion 2102 extends in a direction away from the display region 100. One end of the second strip portion 2102 close to the display region 100 is connected to the first strip portion 2101. The second power supply line 220 includes a third strip portion 2201 and a fourth strip portion 2202. The third strip portion 2201 substantially extends along the first direction, and the third strip portion 2201 has the corner 120. Because the third strip portion 2201 has the corner, an extension direction of the third strip portion 2201 may be different from the first direction, for example, there may be a difference at the corner. The fourth strip portion 2202 extends in a direction away from the display region 100. One end of the fourth strip portion 2202 close to the display region 100 is connected to the third strip portion 2201, for example, to form an angular structure. The second power supply line 220 is located on a side of the first strip portion 2101 away from the display region 100 and on a side of the second strip portion 2102 close to the second peripheral region 300. The first isolation dam 410 and the second isolation dam 420 are arranged on the second strip portion 2102 of the first power supply line 210 and the third strip portion 2201 of the second power supply line 420. The first metal protective structure 510 is arranged on the second strip portion 2102 of the first power supply line 210 and covers the side edge 2103 of the second strip portion 2102 exposed by the organic grooves of the organic insulating layer along a direction parallel to the edge 110 of the display region. The second metal protective structure 520 is arranged on the third strip portion 2201 of the second power supply line 220, and covers the side edge 2203, close to the first power supply line 210, of third strip portion 2201 exposed by the organic grooves of the organic insulating layer.

In at least one exemplary embodiment, as shown in FIG. 3 to FIG. 6, in a plane perpendicular to the display substrate, the first fanout area in the first peripheral region 200 includes: a composite insulating layer 70 formed by a plurality of inorganic insulating layers and arranged on the base substrate 10, the first power supply line 210 and the second power supply line 220 both arranged on the composite insulating layer 70, the organic insulating layer, the first metal protective structure 510, the second metal protective structure 520, the first isolation dam 410 and the second isolation dam 420 that are arranged on the first power supply line 210 and the second power supply line 220, and a first encapsulation layer 25 and a third encapsulation layer 27 that cover the abovementioned structures. The composite insulating layer 70 includes: a first insulating layer 11, a second insulating layer 12, a third insulating layer 13, and a fourth insulating layer 14 that are stacked on the base substrate 10, and the first insulating layer 11 to the fourth insulating layer 14 are all inorganic insulating layers. The organic insulating layer arranged on the first power supply line 210 and the second power supply line 220 includes a first planarization layer 15 and a second planarization layer 17. The first planarization layer 15 is a first organic insulating layer of this embodiment, and the second planarization layer 17 is a second organic insulating layer of this embodiment. The first planarization layer 15 includes two adjacent organic grooves in the first peripheral region 200, and the second isolation dam 420 is arranged between the two organic grooves. The second planarization layer 17 includes three organic grooves in the first peripheral region 200, and the first isolation dam 410 and the second isolation dam 420 are arranged between two adjacent organic grooves. The second planarization layer 17 covers edges of the first metal protective structure 510 and the second metal protective structure 520. The first metal protective structure 510 covers the first power supply line 210 exposed by the organic grooves of the organic insulating layer, and the second metal protective structure 520 covers the second power supply line 220 exposed by the organic grooves of the organic insulating layer. The first power supply line 210 and orthographic projections of the organic grooves of the first planarization layer 15 and the second planarization layer 17 on the base substrate 10 have a first overlapping region 710. The first metal protective structure 510 covers at least one edge of the first overlapping region 710 of the first power supply line 210 that is intersected with the first direction, for example, the side edge 2103. The second power supply line 220 and orthographic projections of the organic grooves of the first planarization layer 15 and the second planarization layer 17 on the base substrate 10 have a second overlapping region 720. The second metal protective structure 520 covers at least one edge of the second overlapping region 720 of the second power supply line 220 that is intersected with the first direction, for example, the side edge 2203. The first metal protective structure 510 and the second metal protective structure 520 exposed by the second planarization layer 17 are covered with the first encapsulation layer 25 and the third encapsulation layer 27. The first isolation dam 410 is formed by a second dam base, a third dam base and a post spacer, and the second isolation dam 420 is formed by a first dam base, a second dam base, a third dam base and a post spacer. The first isolation dam 410 and the second isolation dam 420 are arranged on the first power supply line 210 and the second power supply line 220 and are covered with the first encapsulation layer 25 and the third encapsulation layer 27.

In at least one exemplary embodiment, as shown in FIG. 3 and FIG. 6, the side edge 2103 of the first power supply line 210 close to the second power supply line 220 is exposed by the organic grooves of the first planarization layer 15, and is covered with the first metal protective structure 510; the side edge 2203 of the second power supply line 220 close to the first power supply line 210 is exposed by the organic grooves of the first planarization layer 15 and is covered with the second metal protective structure 520. Taking the third metal protective block 5103 as an example, as shown in FIG. 3 and FIG. 6, in the first direction, the third metal protective block 5103 can cover the side edge of the first power supply line 210 exposed by the organic grooves of the first planarization layer 15. A distance L0 between the side edge of the first power supply line 210 covered with the third metal protective block 5103 and an edge of the third metal protective block 5103 adjacent thereto may range from 5 microns to 15 microns, for example, may be 15 microns. A range of the edge of the power supply line covered by the other metal protective blocks is similar to a coverage range of the third metal protective block 5103, and thus will not be elaborated herein.

In at least one exemplary embodiment, as shown in FIG. 5, in a plane direction perpendicular to the display substrate, the display region 100 includes: the base substrate 10, a driving structure layer arranged on the base substrate 10, the first planarization layer 15 arranged on the driving structure layer, a metal conductive layer arranged on the first planarization layer 15, the second planarization layer 17 arranged on the metal conductive layer, a light emitting element arranged on the second planarization layer 17, and a composite encapsulation layer that covers the light emitting element. The driving structure layer of the display region 100 includes a plurality of transistors and storage capacitors that form a pixel driving circuit. In FIG. 5, a first transistor 101 and a first storage capacitor 102 are taken as an example for illustration. The first transistor 101 may be a driving transistor. The driving structure layer of the display region 100 may include: a first insulating layer 11 arranged on the base substrate 10, an active layer arranged on the first insulating layer 11, a second insulating layer 12 covering the active layer, a first gate metal layer disposed on the second insulating layer 12, a third insulating layer 13 covering the first gate metal layer, a second gate metal layer arranged disposed on the third insulating layer 13, a fourth insulating layer 14 covering the second gate metal layer, and a source-drain metal layer arranged on the fourth insulating layer 14. The active layer may include at least a first active layer, the first gate metal layer may at least include a first gate electrode and a first capacitor electrode, the second gate metal layer may at least include a second capacitor electrode, and the source-drain metal layer may at least include a first source electrode and a first drain electrode. The first active layer, the first gate electrode, the first source electrode, and the first drain electrode form the first transistor 101. The first capacitor electrode and the second capacitor electrode form the first storage capacitor 102. The metal conductive layer at least includes a connection electrode 19. The connection electrode 19 is connected to the first drain electrode of the first transistor 101 through a via formed on the first planarization layer 15. In some embodiments, the source-drain metal layer is referred to as a first source-drain metal layer (SD1), and the metal conductive layer is referred to as a second source-drain metal layer (SD2). The light emitting element includes an anode 21, a pixel define layer 22, an organic light emitting layer 23, and a cathode 24. The anode 21 is connected to the connection electrode 19 through a via formed on the second planarization layer 17 such that a connection between the anode 21 and the first drain electrode of the first transistor 101 is implemented. The composite encapsulation layer includes the first encapsulation layer 25, a second encapsulation layer 26, and the third encapsulation layer 27 that are stacked. The second encapsulation layer 26 prepared from an inorganic material is arranged between the first encapsulation layer 25 and the third encapsulation layer 27 that are prepared from inorganic materials.

In at least one exemplary embodiment, as shown in FIG. 5, the first power supply line 210 and the second power supply line 220 in the first peripheral region 200 are arranged on the fourth insulating layer 14, are arranged in the same layer as the first source electrode and the first drain electrode in the display region 100, and are formed by the same patterning process. The first metal protective structure 510 and the second metal protective structure 520 of the first peripheral region 200 are arranged in the same layer as the metal conductive layer of the display region 100, and are formed by the same patterning process.

In at least one exemplary embodiment, the pixel define layer 22 is arranged on the second planarization layer 17 adjacent to the display region 100, a plurality of post spacers 33 spaced part are arranged on the pixel define layer 22, and the cathode 24 covers the plurality of post spacers 33.

The structure of the display substrate according to the embodiment of the present disclosure will be described below by using an example of a preparation process of the display substrate. The "patterning process" mentioned in the present disclosure includes film layer deposition, coating with a photoresist, mask exposure, developing, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made of a certain material on the base substrate by a deposition or coating process. If the patterning process is not needed for the "thin film" in the whole making process, the "thin film" may also be referred to as a "layer". When the patterning process is needed for the "thin film" in the whole making process, the thin film is referred to as a "thin film" before the patterning process and referred to as a "layer" after the patterning process. The "layer" after the patterning process includes at least one "pattern". That "A and B are arranged in the same layer" mentioned in the present disclosure refers to that A and B are simultaneously formed by the same patterning process.

The preparation process of the display substrate in the embodiment may include the following step (1) to step (8). Descriptions are made in the exemplary embodiment taking a flexible display substrate as an example. FIG. 7 to FIG. 16 are all schematic sectional views along a direction A-A in FIG. 3.

Figure 7:
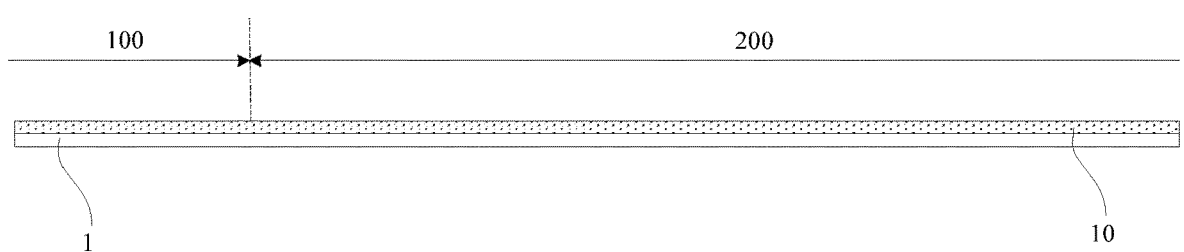
FIG. 7 is a schematic diagram after a pattern of a base substrate is formed according to at least one embodiment of the present disclosure.

(1) A base substrate 10 is prepared on a glass carrier 1. In an exemplary embodiment, the base substrate 10 may be a flexible base substrate, for example, including a first flexible material layer, a first inorganic material layer, a semiconductor layer, a second flexible material layer, and a second inorganic material layer that are stacked on the glass carrier 1. The first flexible material layer and the second flexible material layer are made of materials such as polyimide (PI), polyethylene terephthalate (PET), or a soft polymer film subjected to surface treatment. The first inorganic material layer and the second inorganic material layer are made of silicon nitride (SiNx) or silicon oxide (SiOx), etc., for improving the water and oxygen resistance of the base substrate. The first inorganic material layer and the second inorganic material layer are also referred to as Barrier layers. The semiconductor layer is made of amorphous silicon (a-si). In some exemplary implementation modes, taking a laminated structure of PI1/Barrier1/a-si/PI2/Barrier2 as an example, its preparation process includes: firstly, coating a layer of polyimide on the glass carrier 1, curing into a film to form a first flexible (PI1) layer; then, depositing a barrier film on the first flexible layer to form a first barrier layer (Barrier1) covering the first flexible layer; then depositing an amorphous silicon film on the first barrier layer to form an amorphous silicon (a-si) layer covering the first barrier layer; then coating the amorphous silicon layer with a layer of polyimide, curing into a film to form a second flexible (PI2) layer; then, depositing a barrier thin film on the second flexible layer to form a second barrier (Barrier 2) layer covering the second flexible layer, thereby completing the preparation of the flexible base substrate 10, as shown in FIG. 7. After this process, both the display region 100 and the first peripheral region 200 include the base substrate 10.

(2) Patterns of a driving structure layer and a power supply line are prepared on the base substrate 10. In an exemplary embodiment, the driving structure layer of the display region 100 includes: a first transistor 101 and a first storage capacitor 102 that form a pixel driving circuit, and the first peripheral region 200 includes a first power supply line 210 and a second power supply line 220.

In some exemplary implementation modes, a preparation process of the driving structure layer may refer to the following descriptions.

A first insulating thin film and an active layer thin film are sequentially deposited on the base substrate 10. The active layer thin film is patterned through a patterning process to form a first insulating layer 11 covering the whole base substrate 10 and a pattern of an active layer arranged on the first insulating layer 11. The pattern of the active layer at least includes a first active layer. After this patterning process, the first peripheral region 200 may include the first insulating layer 11 arranged on the base substrate 10.

Then, a second insulating thin film and a first metal thin film are sequentially deposited. The first metal thin film is patterned through a patterning process to form a second insulating layer 12 covering the pattern of the active layer and a pattern of a first gate metal layer arranged on the second insulating layer 12. The pattern of the first gate metal layer at least may include a first gate electrode and a first capacitor electrode. After this patterning process, the first peripheral region 200 may include the first insulating layer 11 and the second insulating layer 12 that are stacked on the base substrate 10.

Then, a third insulating thin film and a second metal thin film are sequentially deposited. The second metal thin film is patterned through a patterning process to form a third insulating layer 13 covering the first gate metal layer and a pattern of a second gate metal layer arranged on the third insulating layer 13. The pattern of the second gate metal layer at least includes a second capacitor electrode. A position of the second capacitor electrode corresponds to that of the first capacitor electrode. After this patterning process, the first peripheral region 200 may include the first insulating layer 11, the second insulating layer 12, and the third insulating layer 13 that are stacked on the base substrate 10.

Then, a fourth insulating thin film is deposited. The fourth insulating thin film is patterned through a patterning process to form a pattern of a fourth insulating layer 14 covering the second gate metal layer. At least two first vias are formed on the fourth insulating layer 14. The fourth insulating layer 14, third insulating layer 13 and second insulating layer 12 in the two first vias are etched away to expose a surface of the first active layer. After this patterning process, the first peripheral region 200 may include the first insulating layer 11, the second insulating layer 12, the third insulating layer 13, and the fourth insulating layer 14 that are stacked on the base substrate 10.

Then, a third metal thin film is deposited. The third metal thin film is patterned through a patterning process to form a pattern of a source-drain metal layer on the fourth insulating layer 14. The source-drain metal layer at least includes a first source electrode and a first drain electrode located in the display region 100, and the first power supply line 210 and the second power supply line 220 located in the first peripheral region 200. The first source electrode and the first drain electrode may be connected to the first active layer through the first vias respectively.

Figure 8:
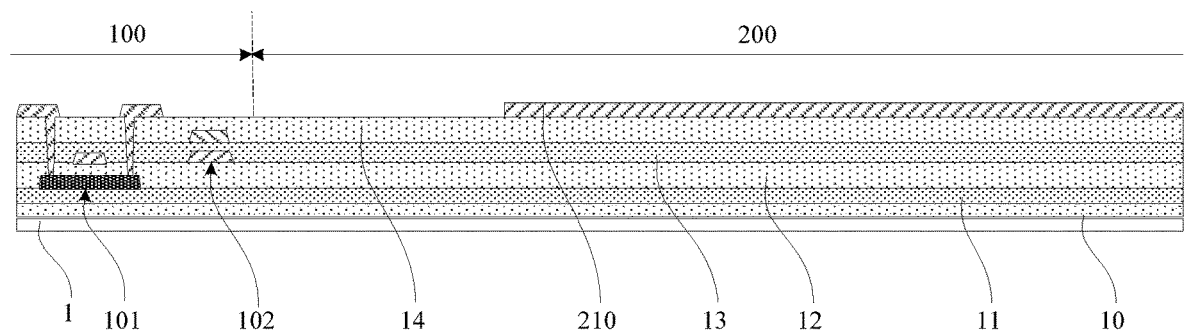
FIG. 8 is a schematic diagram after patterns of a driving structure layer and a power supply line are formed according to at least one embodiment of the present disclosure.

So far, the preparation of the driving structure layer in the display region 100 and the pattern of power supply lines of the first peripheral region 200 on the base substrate 10 are completed, as shown in FIG. 8. In the driving structure layer in the display region 100, the first active layer, the first gate electrode, the first source electrode, and the first drain electrode may form the first transistor 101, and the first capacitor electrode and the second capacitor electrode may form the first storage capacitor 102. The first peripheral region 200 includes a composite insulating layer arranged on the base substrate 10, and the first power supply line 210 and the second power supply line 220 arranged on the composite insulating layer. The composite insulating layer includes the first insulating layer 11, the second insulating layer 12, the third insulating layer 13, and the fourth insulating layer 14 that are stacked. In some examples, a spacing between the first power supply line 210 and the second power supply line 220 is about 50 μm to about 100 μm.

In some exemplary implementations, the first insulating layer 11, the second insulating layer 12, the third insulating layer 13 and the fourth insulating layer 14 are made of any one or more of silicon oxide (SiOx), silicon nitride (SiNx), and silicon oxynitride (SiON), and may be single-layer, multilayer, or composite. The first insulating layer 11 is referred to as a Buffer layer, for improving the water and oxygen resistance of the base substrate. The second insulating layer 12 and the third insulating layer 13 are referred to as Gate Insulator (GI) layers. The fourth insulating layer 14 is referred to as an Interlayer Dielectric (ILD) layer. The first metal thin film, the second metal thin film, and the third metal thin film are made of metal materials, such as any one or more of Argentum (Ag), Copper (Cu), Aluminum (Al), Titanium (Ti), and Molybdenum (Mo), or alloy materials of the above-mentioned metals, such as an Aluminum-Neodymium alloy (AlNd) or a Molybdenum-Niobium alloy (MoNb), and may be of single-layer structures, or multilayer composite structures such as Ti/Al/Ti. The active layer thin film is made of one or more materials such as amorphous indium gallium zinc oxide (a-IGZO), zinc oxynitride (ZnON), indium zinc tin oxide (IZTO), amorphous silicon (a-Si), polysilicon (p-Si), sexithiophene, and polythiophene. That is, the present disclosure is applicable to a transistor manufactured based on an oxide technology, a silicon technology, and an organic matter technology.

Figure 9:
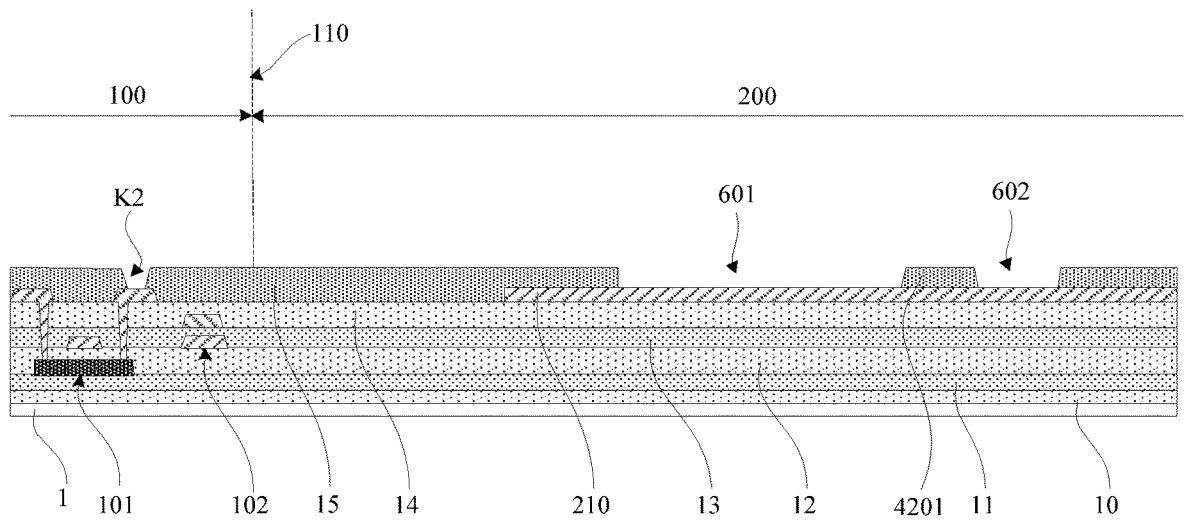
FIG. 9 is a schematic diagram after a pattern of a first planarization layer is formed according to at least one embodiment of the present disclosure.

(3) A first organic insulating layer is formed on the base substrate 10 formed with the foregoing patterns. In some exemplary implementation, a planarization thin film made of an organic material is coated on the base substrate 10 formed with the foregoing patterns to form a first planarization (PLN) layer 15 covering the entire base substrate 10; by masking, exposing, and developing processes, patterns of a second via K2, organic grooves 601 and 602 and a first dam base 4201 are formed on the first planarization (PLN) layer 15. The second via K2 is formed in the display region 100, and the first planarization layer 15 in the second via K2 is developed away to expose a surface of the first drain electrode of the first transistor 101. The organic grooves 601 and 602 are formed on the first power supply line 210 and the second power supply line 220 in the first peripheral region 200, and the first dam base 4201 is formed between the organic grooves 601 and 602. The first planarization layer 15 in the organic grooves 601 and 602 is developed away, exposing surfaces of the first power supply line 210 and the second power supply line 220, as shown in FIG. 9. The first power supply line 210 is overlapped with orthographic projections of the organic grooves 601 and 602 on the base substrate 10. The second power supply line 220 is overlapped with the orthographic projections of the organic grooves 601 and 602 on the base substrate 10.

In the exemplary implementation, the first dam base 4201 is a dam base of the second isolation dam. In some examples, a width of the first dam base 4201 is about 20 μm to about 60 μm. In some examples, a total width of the organic groove 601, the first dam base 4201, and the organic groove 602 is about 300 μm. However, no limits are made thereto in the present embodiment.

(4) Patterns of a metal conductive layer and a metal protective structure are formed on the base substrate 10 formed with the foregoing patterns. In some exemplary implementation, patterns of a metal conductive layer, a first metal protective structure 510, and a second metal protective structure 520 are formed on the first planarization layer 15. The metal conductive layer is located in the display region 100, and the first metal protective structure 510 and the second metal protective structure 520 are located in the first peripheral region 200. The metal conductive layer of the display region 100 at least includes the connection electrode 19. The connection electrode 19 is connected to the first drain electrode of the first transistor 101 through the second via K2. The first metal protective structure 510 covers an edge of the first overlapping region 710 of the first power supply line 210 that is intersected with the first direction, for example, a side edge 2103. The second metal protective structure 520 covers an edge of the second overlapping region 720 of the second power supply line 220 that is intersected with the first direction, for example, a side edge 2203.

Figure 10:
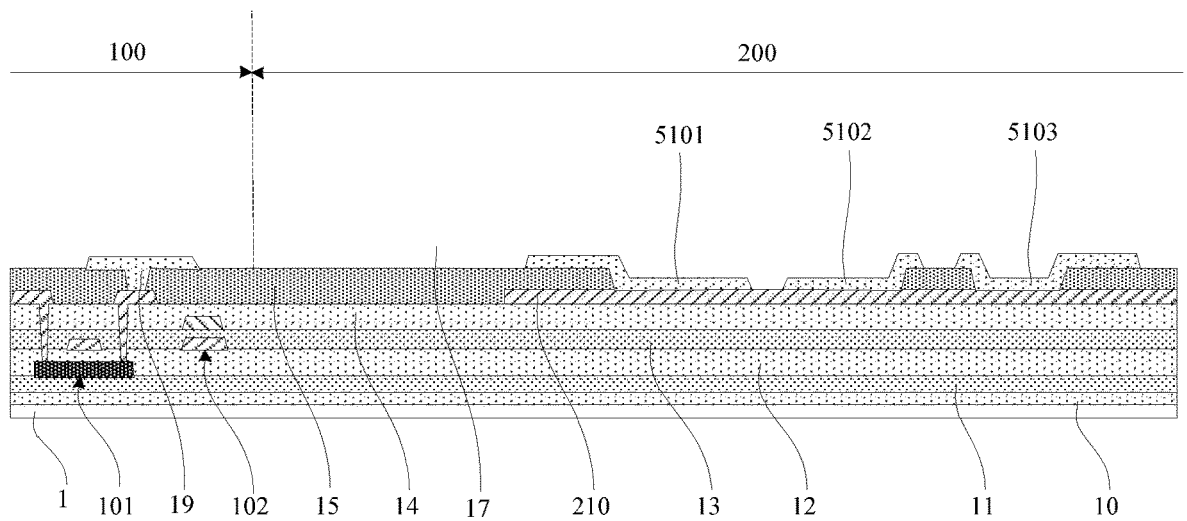
FIG. 10 is a schematic diagram after a metal conductive layer and a metal protective structure are formed according to at least one embodiment of the present disclosure.

In some exemplary implementations, as shown in FIG. 3, FIG. 4 and FIG. 10, the first metal protective structure 510 includes a first metal protective block 5101, a second metal protective block 5102, and a third metal protective block 5103 that extend along the first direction. The first metal protective block 5101 and the second metal protective block 5102 are disconnected in the organic groove 601, and a first isolation dam can be formed at the disconnected position of the first metal protective block 5101 and the second metal protective block 5102, subsequently. An edge of the first metal protective block 5101 close to the display region 100 may cover the first planarization layer 15 at an edge of the organic groove 601 close to the display region 100. An edge of the second metal protective block 5102 away from the display region 100 may cover an edge of the first dam base 4201 close to the display region 100. An edge of the third metal protective block 5103 close to the display region 100 may cover an edge of the first dam base 4201 away from the display region 100. The second metal protective block 5102 and the third metal protective block 5103 are disconnected in the first dam base 4201. That is, Both the second metal protective block 5102 and the third metal protective block 5103 are overlapped with the first dam base 4201, and there is an interval between adjacent edges of the second metal protective block 5102 and the third metal protective block 5103. An edge of the third metal protective block 5103 away from the display region 100 may cover the first planarization layer 15 at an edge of the organic groove 602 away from the display region 100. However, no limits are made thereto in the present embodiment. In some examples, the edge of the third metal protective block 5103 away from the display region 100 may not cover the first planarization layer 15 at the edge of the organic groove 602 away from the display region 100.

In some exemplary embodiments, as shown in FIG. 3 and FIG. 4, the second metal protective structure 520 includes a fourth metal protective block 5201, a fifth metal protective block 5202, and a sixth metal protective block 5203 that respectively extend along the first direction. The fourth metal protective block 5201 and the fifth metal protective block 5202 are disconnected in the organic groove 601 of the first planarization layer 15. Subsequently, the first isolation dam can be formed at the disconnected position of the fourth metal protective block 5201 and the fifth metal protective block 5202 in the organic groove 601, and the fourth metal protective block 5201 and the fifth metal protective block 5202 are also disconnected at the corner 120 of the second power supply line 220. The fifth metal protective block 5202 and the sixth metal protective block 5203 are disconnected in the first dam base 4201. Subsequently, the second isolation dam can be formed on the first dam base 4201, and the fourth metal protective block 5201 and the sixth metal protective block 5203 are disconnected at the corner 120 of the second power supply line 220.

In some exemplary implementations, as shown in FIG. 3, FIG. 4 and FIG. 10, the first metal protective structure 510 covers the side edge 2103 of the first power supply line 210 exposed by the organic grooves 601 and 602 of the first planarization layer 15. The second metal protective structure 520 covers the side edge 2203 of the second power supply lines 220 exposed by the organic grooves 601 and 602 of the first planarization layer 15.

Figure 11:
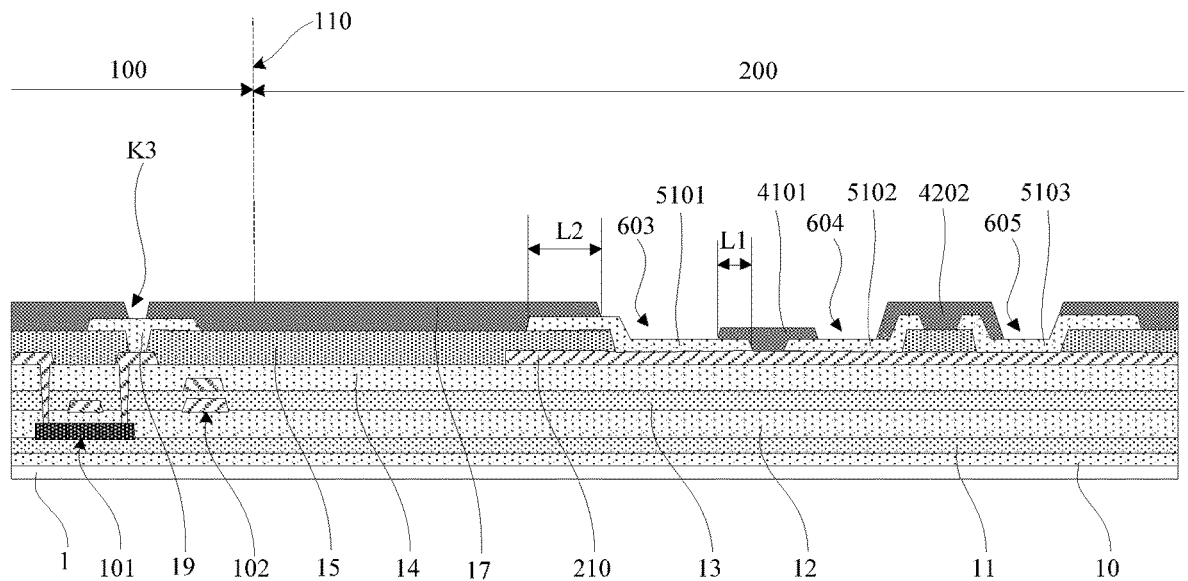
FIG. 11 is a schematic diagram after a pattern of a second planarization layer is formed according to at least one embodiment of the present disclosure.

(5) A second organic insulating layer is formed on the base substrate 10 formed with the foregoing patterns. In some exemplary implementations, a planarization thin film made of an organic material is coated on the base substrate 10 formed with the foregoing patterns to form a second planarization (PLN) layer 17 covering the entire base substrate 10; by masking, exposing, and developing processes, patterns of a third via K3, organic grooves 603, 604 and 605, and second dam bases 4101 and 4202 are formed on the second planarization (PLN) layer 17, as shown in FIG. 11. The third via K3 is formed on the second planarization layer 17 of the display region 100, and the third via K3 can expose a surface of the connection electrode 19. The organic grooves 603, 604 and 605 are formed on the second planarization layer 17 of the first peripheral region 200. The organic groove 605 corresponds to the organic groove 602 on the first planarization layer 15, and the organic grooves 603 and 604 correspond to the organic groove 601 on the first planarization layer 15. The organic groove 601 is divided into the organic groove 603 and the organic groove 604 by the second dam base 4101. The second dam base 4202 is arranged on the first dam base 4201 and is located between the organic groove 604 and the organic groove 605. The second planarization layer 17 in the organic grooves 603, 604 and 605 is all developed away to expose surfaces of the first metal protective structure 510 and the second metal protective structure 520. The second planarization layer 17 covers edges of the first metal protective structure 510 and the second metal protective structure 520. The second dam base 4101 covers adjacent edges of the first metal protective block 5101 and the second metal protective block 5102, and the second dam base 4202 covers adjacent edges of the second metal protective block 5102 and the third metal protective block 5103. Similarly, the second dam base 4101 covers adjacent edges of the fourth metal protective block 5201 and the fifth metal protective block 5202, and the second dam base 4202 covers adjacent edges of the fifth metal protective block 5202 and the sixth metal protective block 5203.

In some exemplary implementations, along a direction away from the display region, a distance between an edge of an orthographic projection of any second dam base on the base substrate 10 and an edge of an orthographic projection of the metal protective block covered by the second dam base on the base substrate may range from 5 μm to 10 μm, for example, may be 9 μm. As shown in FIG. 10, along a direction away from the display region 100, a distance L1 between an edge of the second dam base 4101 close to the display region 100 and an edge of the first metal protective block 5101 away from the display region 100 may range from 5 μm to 10 μm, for example, may be 9 μm.

In some exemplary implementations, as shown in FIG. 11, at an edge of the organic groove 603 close to the display region 100, a distance L2 between an edge of the second planarization layer 17 away from the display region 100 and an edge of the first metal protective block 5101 close to the display region 100 is, for example, about 20 μm. At an edge of the organic trench 605 away from the display region 100, a distance between an edge of the second planarization layer 17 close to the display region 100 and an edge of the third metal protective block 5103 away from the display region 100 is, for example, about 20 μm. However, no limits are made thereto in the present embodiment. In some examples, the above distances may be determined according to actual conditions.

Figure 12:
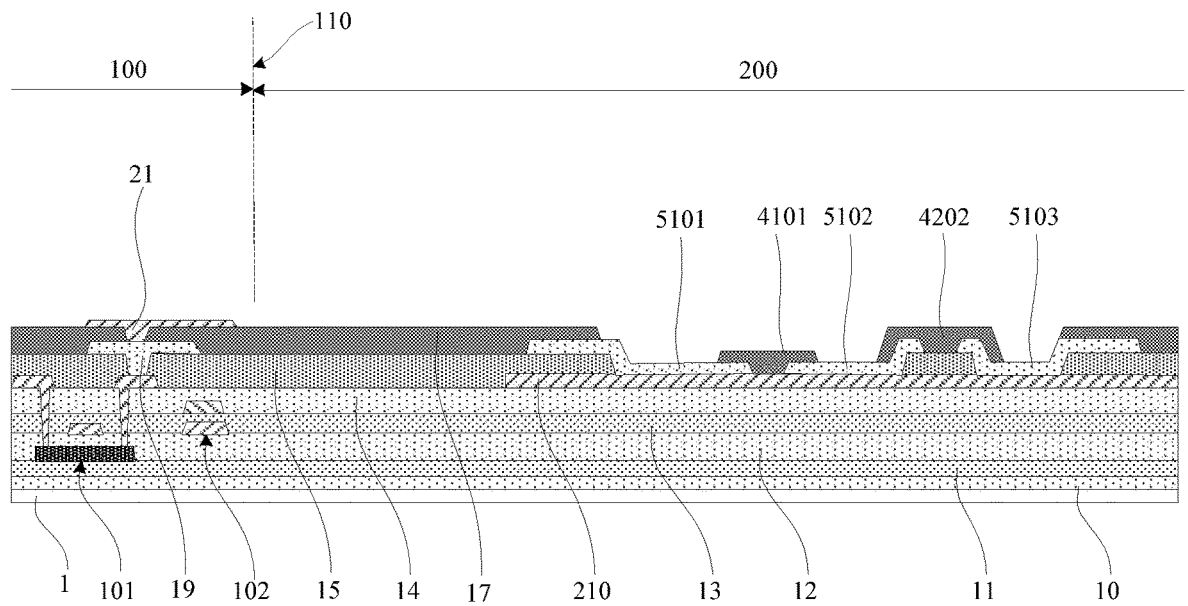
FIG. 12 is a schematic diagram after a pattern of an anode is formed according to at least one embodiment of the present disclosure.

(6) A pattern of an anode is formed on the base substrate 10 formed with the foregoing patterns. In some exemplary implementations, a transparent conductive film is deposited on the base substrate 10 formed with the foregoing patterns, the transparent conductive film is patterned through a patterning process to form a pattern of an anode 21, and the anode 21 is formed on the second planarization layer 17 of the display region 100, and is connected to the connection electrode 19 through the third via K3, as shown in FIG. 12. The connection electrode 19 is connected to the first drain electrode of the first transistor 101, and the anode 21 is connected to the first drain electrode of the first transistor 101 through the connection electrode 19. After this patterning process, a film-layer structure of the first peripheral region 200 does not change. In some examples, the transparent conductive film is made of indium tin oxide (ITO) or indium zinc oxide (IZO).

Figure 13:
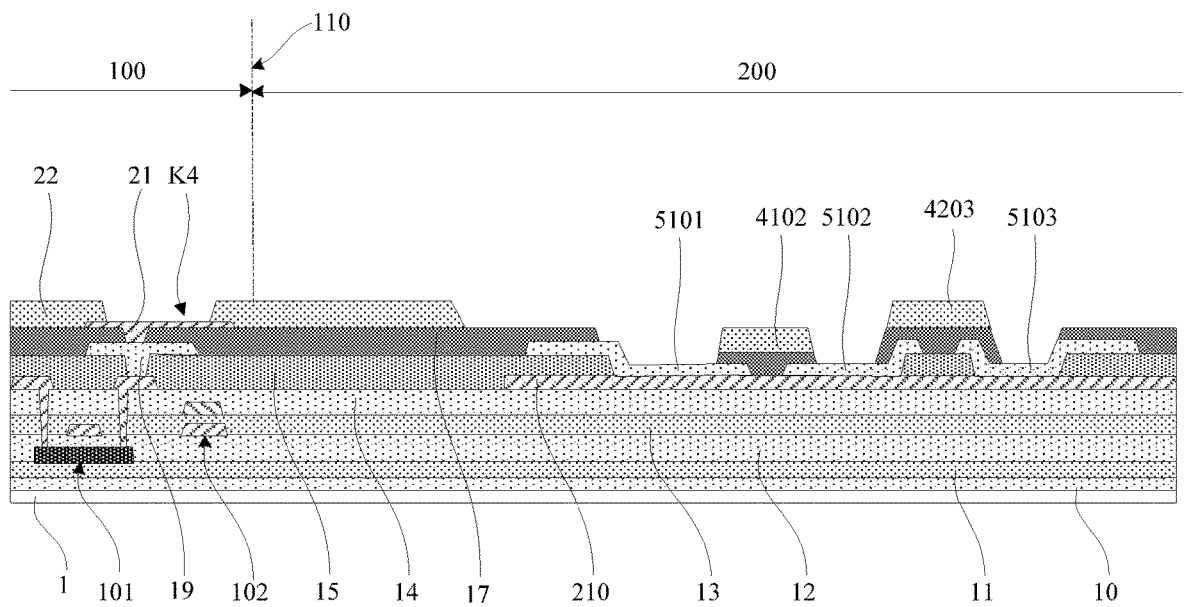
FIG. 13 is a schematic diagram after a pattern of a pixel define layer is formed according to at least one embodiment of the present disclosure.

(7) A pattern of a pixel define layer is formed on the base substrate 10 formed with the foregoing patterns. In some exemplary implementation, the base substrate 10 formed with the foregoing patterns is coated with a pixel definition thin film. Patterns of a Pixel define layer (PDL) 22, and third dam bases 4102 and 4203 are formed by masking, exposing, and developing processes. As shown in FIG. 13, the pixel define layer 22 is formed on the display region 100 and a part of the first peripheral region 200 adjacent to the display region 100. The pixel define layer 22 of the display region 100 is provided with a pixel opening K4, and the pixel define layer 22 in the pixel opening K4 is developed away to expose a surface of the anode 21. The third dam base 4102 is formed on the second dam base 4101, and the third dam base 4203 is formed on the second dam base 4202. A distance between the third dam base 4102 and the display region 100 is less than a distance between the third dam base 4203 and the display region 100. In the exemplary embodiment, the second dam base 4101 and the third dam base 4102 are used for forming the first isolation dam 410, and the first dam base 4201, the second dam base 4202, and the third dam base 4203 are used for forming the second isolation dam 420. In some exemplary implementations, the pixel define layer 22 may be made of a material such as polyimide, acrylic, or polyethylene terephthalate.

Figure 14:
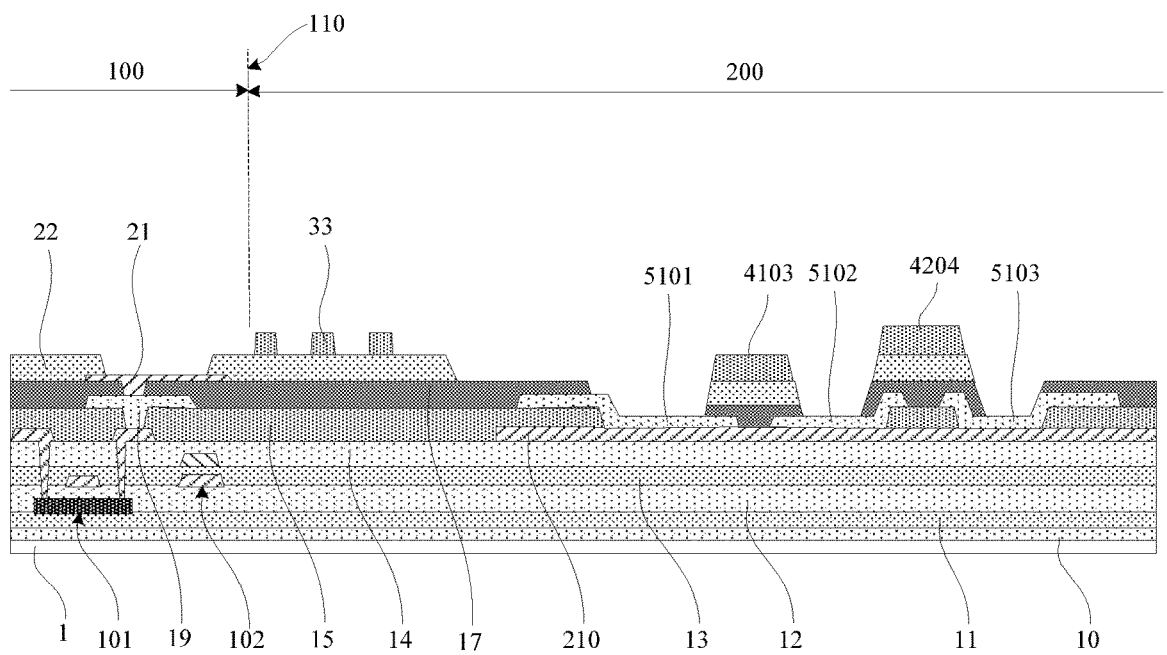
FIG. 14 is a schematic diagram after a pattern of a post spacer is formed according to at least one embodiment of the present disclosure.

(8) A pattern of post spacers is formed on the base substrate 10 formed with the foregoing patterns. In some exemplary implementations, an organic material thin film is coated on the base substrate 10 formed with the foregoing patterns, patterns of a plurality of Post Spacer (PS) are formed by masking, exposing, and developing processes, and the plurality of post spacers are respectively formed on the pixel define layer 22 and the third dam bases 4102 and 4203 in the first peripheral region 200, as shown in FIG. 14.

In some exemplary implementations, in a direction perpendicular to the base substrate 10, the cross-sectional shapes of the first dam base 4201, the second dam bases 4101 and 4202, the third dam bases 4102 and 4103, and the post spacers 33, 4103 and 4204 are trapezoidal or rectangular. The second dam base 4101, the third dam base 4102 and the post spacer 4103 thereon form the first isolation dam 410. The first dam base 4201, the second dam base 4202, the third dam base 4203 and the post spacer 4204 thereon form the second isolation dam 420. A distance between an upper end surface of the first isolation dam 410 and the base substrate 10 is less than a distance between an upper end surface of the second isolation dam 420 and the base substrate 10, and a distance between the first isolation dam 410 and the display region 100 is less than a distance between the second isolation dam 420 and the display region 100.

In some exemplary implementations, in a direction away from the display region 100, a width of an orthographic projection of each of the first isolation dam 410 and the second isolation dam 420 on the base substrate 10 is about 20 μm to about 60 μm, and a spacing between the first isolation dam 410 and the second isolation dam 420 is about 20 μm to about 60 μm. In some embodiments, the width of the orthographic projection of each of the first isolation dam 410 and the second isolation dam 420 on the base substrate 10 is about 40 μm, and the distance between the first isolation dam 410 and the second isolation dam 420 is about 40 μm. The first isolation dam and a second isolation dam are simultaneously formed in the first peripheral region 200 and the second peripheral region 300. The first isolation dam in the first peripheral region 200 and the first isolation dam in the second peripheral region 300 form an integrated structure, and the second isolation dam in the first peripheral region 200 and the second isolation dam in the second peripheral region 300 form an integrated structure.

Figure 15:
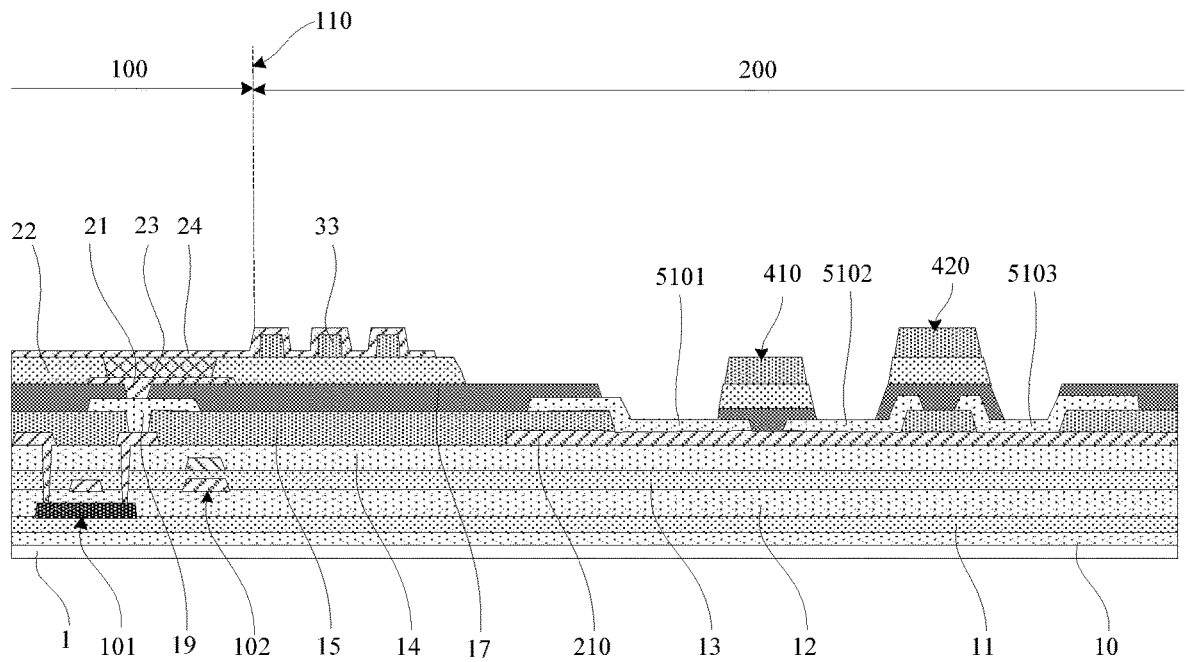
FIG. 15 is a schematic diagram after patterns of an organic light emitting layer and a cathode are formed according to at least one embodiment of the present disclosure.

(9) An organic light emitting layer and a cathode are formed on the base substrate 10 formed with the foregoing patterns. In some exemplary implementations, an organic light emitting layer 23 and a cathode 24 are sequentially formed on the base substrate 10 formed with the foregoing patterns, as shown in FIG. 15. The organic light emitting layer 23 includes a hole injection layer, hole transport layer, emitting layer, electron transport layer, and electron injection layer that are stacked, and is formed in the pixel opening K4 of the display region 100, to connect the organic light emitting layer 23 to the anode 21. The cathode 24 is formed on the pixel define layer 22 and connected to the organic light emitting layer 23, and covers a plurality of post spacers 33 on the pixel define layer 22.

In some exemplary implementation modes, the cathode is made of any one or more of magnesium (Mg), silver (Ag), aluminum (Al), copper (Cu) and lithium (Li), or an alloy made of any one or more of the above metals.

Figure 16:
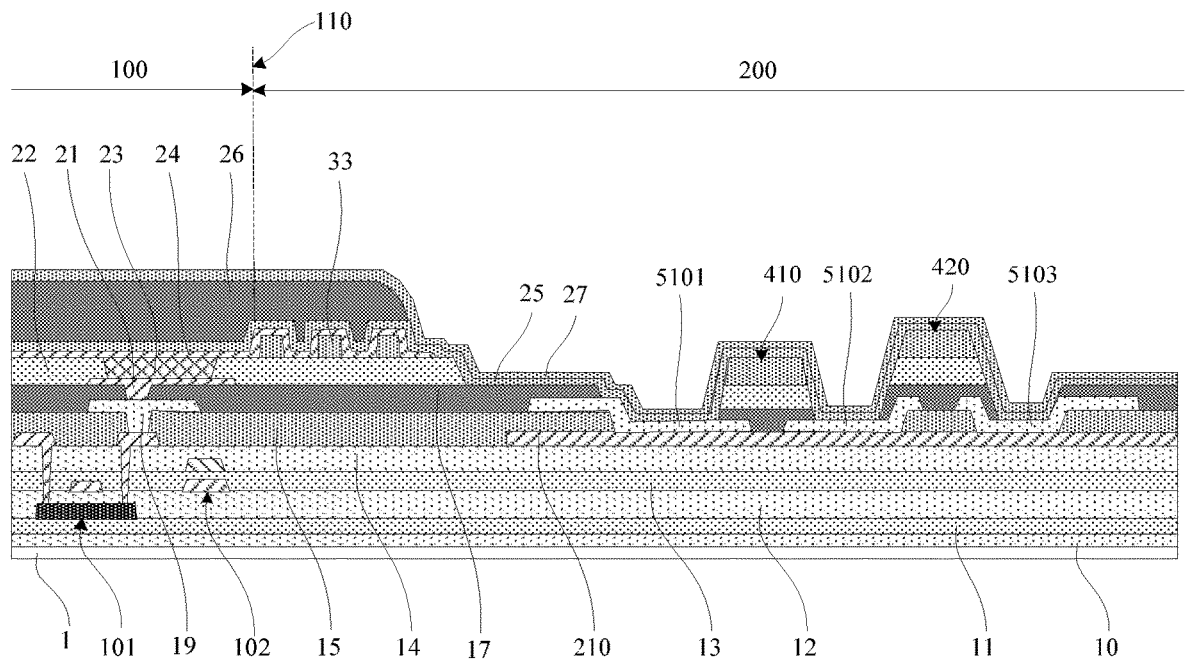
FIG. 16 is a schematic diagram after a pattern of an encapsulation layer is formed according to an exemplary embodiment of the present disclosure.

(10) An encapsulation layer is formed on the base substrate 10 formed with the foregoing patterns. In some exemplary implementations, the encapsulation layer is formed on the base substrate 10 formed with the foregoing patterns. The encapsulation layer may include a first encapsulation layer 25, a second encapsulation layer 26, and a third encapsulation layer 27 that are stacked, as shown in FIG. 16. The first encapsulation layer 25 is made of an inorganic material, covers the cathode 24 in the display region 100, wraps the plurality of post spacers 33 in the first peripheral region 200, covers the first metal protective structure 510 and the second metal protective structure 520, and wraps the first isolation dam 410 and the second isolation dam 420. The second encapsulation layer 26 is made of an organic material, and is arranged on the display region 100 and a region where the post spacers 33 of the first peripheral region 200 are located. The third encapsulation layer 27 is made of an inorganic material, and covers the first encapsulation layer 25 and the second encapsulation layer 26. The first encapsulation layer 25 and the third encapsulation layer 27 made of the inorganic materials directly cover the first metal protective structure 510 and the second metal protective structure 520, which can ensure that the external vapor cannot enter the display region 100, thereby improving the encapsulation effect and processing quality.

Figure 17:
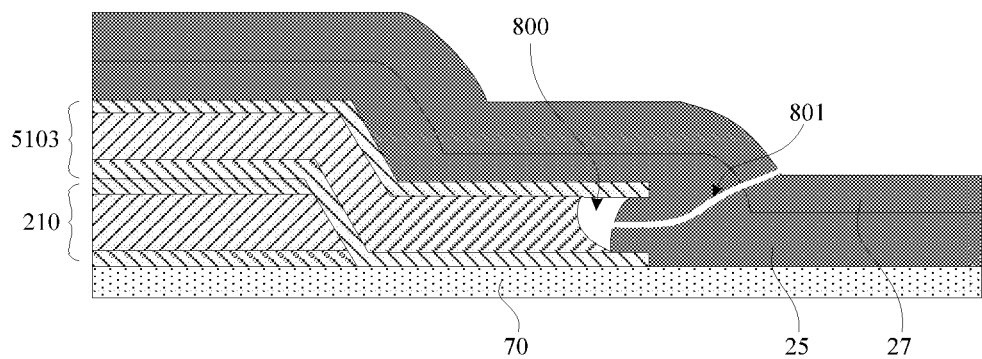
FIG. 17 is a schematic diagram of a structure of an edge of a power supply line according to at least one embodiment of the present disclosure.

FIG. 17 is a schematic diagram of a structure of an edge of a power supply line according to at least one embodiment of the present disclosure, and is an enlarged view of a region D in FIG. 6. In an exemplary implementation, in order to form the first isolation dam 410 and the second isolation dam 420 in the first peripheral region 200, in a process of forming the first planarization layer 15, organic grooves are formed, the first planarization layer 15 in the organic grooves are all removed, and the first power supply line 210 and the second power supply line 220 in the organic grooves are covered with the metal protective structure. In a process of forming the second planarization layer 17, the second planarization layer 17 in regions near the first isolation dam 410 and the second isolation dam 420 in the organic grooves of the first planarization layer 15 is removed, so that after the second planarization layer 17 is formed, side edges of the metal protective structure in the organic grooves are exposed. The side edges of the metal protective structure are directly covered with the inorganic encapsulation layer. The first power supply line, the second power supply line, and the metal protective structure may usually adopt a multi-layer composite structure of Ti/Al/Ti, and the middle layer of aluminum has high activity and is easy to be corroded by aqueous liquids. As shown in FIG. 17, when the inorganic encapsulation layer (including the first encapsulation layer 25 and the third encapsulation layer 27) has a crack, water and oxygen will enter the first metal protective structure 510 along a crack 801 of the encapsulation layer. Taking the third metal protective block 5103 as an example, a middle aluminum layer of the third metal protective block 5103 is easy to be corroded, but a titanium layer of the third metal protective block 5103 may block water and oxygen from entering from the side edge of the first power supply line 210, thereby extending a water and oxygen intrusion path. Moreover, even if water and oxygen enter along the aluminum layer of the third metal protective block 5103, because the third metal protective block 5103 is disconnected from other metal protective blocks (i.e., being spaced apart), the formation of a communicated water and oxygen channel in the metal protective structure may be avoided. With the arrangement that the metal protective structure covers the edges of the first power supply line and the second power supply line, vapor is blocked by the metal protective structure and needs to bypass the metal protective structure to enter the display region, and thus the intrusion path is greatly extended, reducing the risk of occurrence of GDS, avoiding poor display of the display substrate, and improving the display quality. Moreover, the use of the metal protective structure to cover the first power supply line and the second power supply line that are not covered with the first planarization layer may prevent etching gas continuing to erode the first power supply line and the second power supply line after the etching of the metal conductive layer is finished during a dry etching process of the metal conductive layer in the display region.

According to the display substrate of the exemplary embodiment, the first metal protective structure and the second metal protective structure are used in the first peripheral region to cover surfaces of the first power supply line and the second power supply line exposed by the organic grooves of the first planarization layer, and wrap at least one edge of the overlapping region, intersected with the first direction, between the power supply line and the organic grooves, so that the vapor intrusion route may be blocked at the edges of the first power supply line and the second power supply line. Moreover, the first metal protective structure and the second metal protective structure are both disconnected in the first isolation dam and the second isolation dam, and the formation of the communicated water and oxygen channel in the metal protective structure can be avoided, thereby reducing the risk of occurrence of GDS, avoiding poor display of the display substrate, and improving the display quality.

The preparation process of this exemplary embodiment may be implemented by using the existing mature preparation equipment, which has slight improvement on the existing processes, and can be well compatible with the existing preparation processes. The processes are easy to realize and easy to implement, the production efficiency is high, the production cost is low, and the yield is high. Because the structure and process route of the power supply line passing through the isolation dam are relatively common, there is a high possibility of a vapor intrusion path occurred at the edge of the power supply line, and thus the solution of this exemplary embodiment has broad application prospects.

The structure of the display substrate of the exemplary embodiment and the preparation process thereof are described only as an example. In some exemplary implementations, changes in corresponding structures and addition or deletion of the patterning process may be made as practically required. For example, in a plane parallel to the display substrate, the first metal protective block or the second metal protective block may have a shape of rounded rectangle or other irregular shape. No limits are made thereto in the present embodiment.

The structure (or method) shown in the present implementation may be combined with structures (or methods) shown in other implementations as appropriate.

Figure 18:
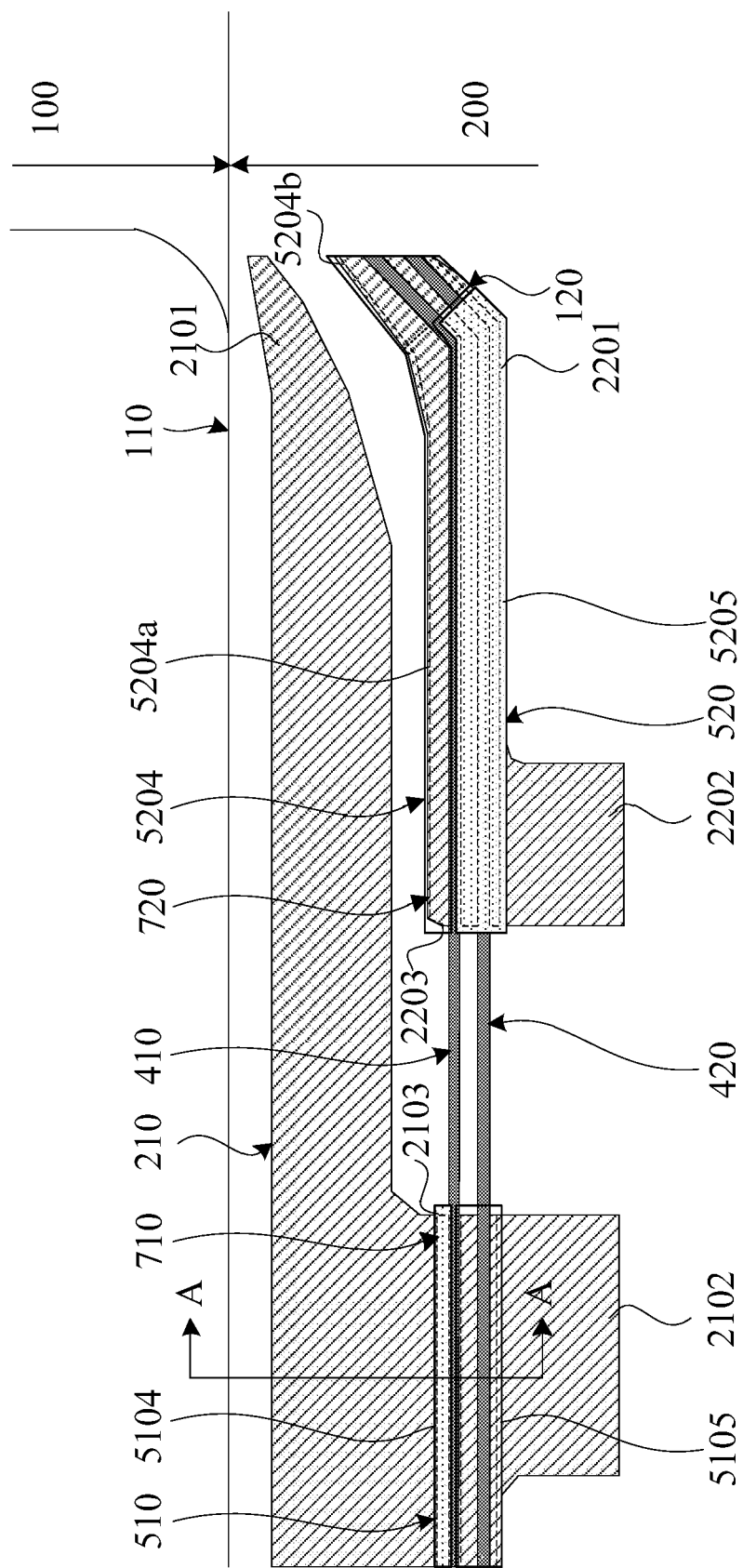
FIG. 18 is schematic diagram of another structure of a first fanout area according to at least one embodiment of the present disclosure.
Figure 19:
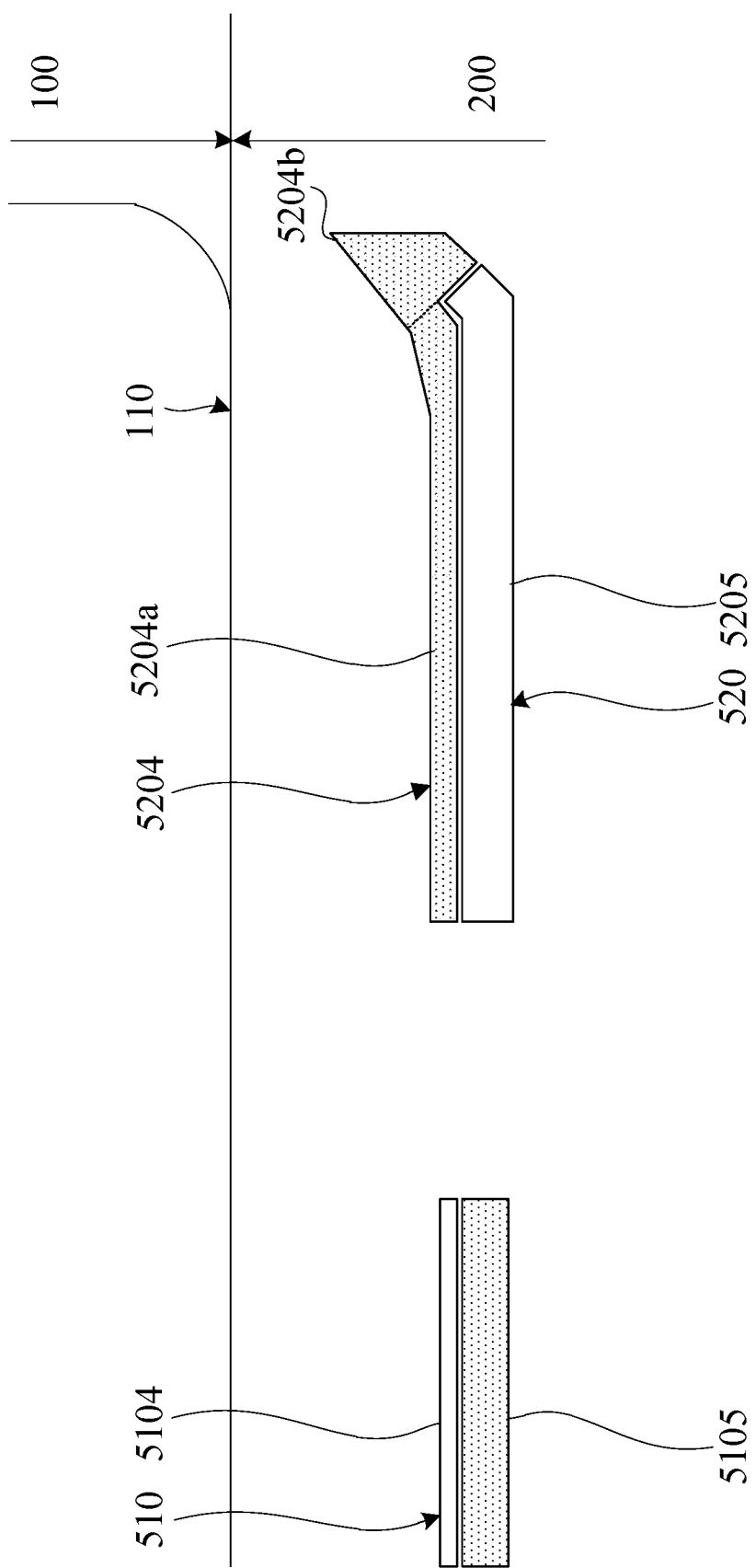
FIG. 19 is a top view of a metal protective structure in FIG. 18.
Figure 20:
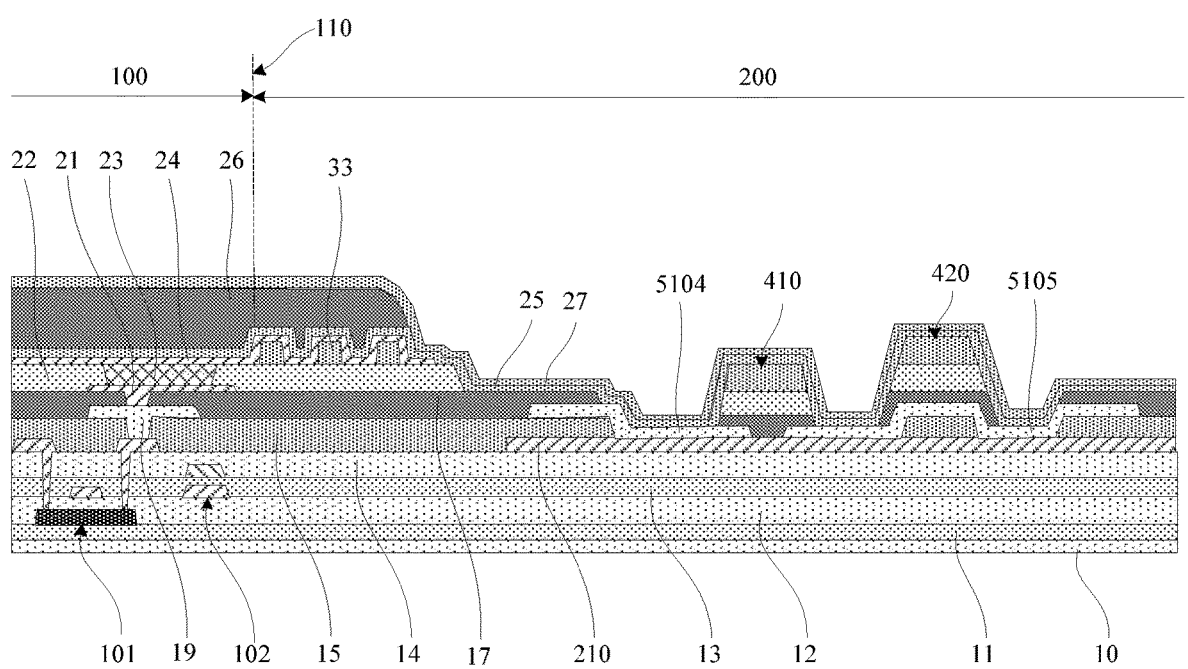
FIG. 20 is a schematic sectional view along a direction A-A in FIG. 18.

FIG. 18 is another schematic diagram of another structure of a first fanout area according to at least one embodiment of the present disclosure, and is an enlarged view of a region C in FIG. 2. FIG. 19 is a top view of a metal protective structure in FIG. 18. FIG. 20 is a schematic sectional view along a direction A-A in FIG. 18.

In at least one exemplary embodiment, as shown in FIG. 18 and FIG. 19, in a plane parallel to the display substrate, the first peripheral region 200 is located between the display region 100 and the bonding region. The first metal protective structure 510 in the first peripheral region 200 is disconnected in the first isolation dam 410, and the second metal protective structure 520 is disconnected at the corner 120 of the first isolation dam 410 and the second power supply line 220. The first metal protective structure 510 includes: a first metal protective block 5104, and a second metal protective block 5105. The second metal protective structure 520 includes: a fourth metal protective block 5204 and a fifth metal protective block 5205. The first power supply line 210 and orthographic projections of the organic grooves of the first planarization layer 15 and the second planarization layer 17 on the base substrate have a first overlapping region 710. The first metal protective structure 510 covers at least one edge of the first overlapping region 710 of the first power supply line 210 that is intersected with the first direction, for example, a side edge 2103. An orthographic projection of the second power supply line 220 and orthographic projections of the organic grooves of the first planarization layer 15 and the second planarization layer 17 on the base substrate have a second overlapping region 720. The second metal protective structure 520 covers at least one edge of the second overlapping region 720 of the second power supply line 220 intersected with the first direction, for example, a side edge 2203.

In at least one exemplary embodiment, as shown in FIG. 18 and FIG. 19, the first metal protective structure 5104 and the second metal protective block 5105 are sequentially arranged in a direction away from the display region 100, and are both rectangles, for example, rounded rectangles. The first metal protective block 5104 and the second metal protective block 5105 respectively extend along the first direction. The first metal protective block 5104 and the second metal protective block 5105 cover the side edge 2103 of the first power supply line 210 exposed by the organic grooves of the organic insulating layer 15. In some examples, in the first direction, a length of any metal protective block is greater than a length of the first power supply line 210 covered with the metal protective block.

In at least one exemplary embodiment, as shown in FIG. 18 and FIG. 19, the first metal protective structure 5104 is located on a side of the first isolation dam 410 close to the display region 100. The first metal protective block 5104 and the second metal protective block 5105 are disconnected in the first isolation dam 410. Both the first metal protective block 5104 and the second metal protective block 5105 are overlapped with the first isolation dam 410, and there is an interval between adjacent edges of the first metal protective block 5104 and the second metal protective block 5105. In some examples, a distance between an edge of the second metal protective block 5105 away from the display region 100 and the edge 110 of the display region is greater than a distance between an edge of the second isolation dam 420 away from the display region 100 and the edge 110 of the display region. A width of the second metal protective block 5105 is greater than the sum of a distance between the first isolation dam 410 and the second isolation dam 420 and a width of the second isolation dam 420.

In at least one exemplary embodiment, as shown in FIG. 18 and FIG. 19, the fourth metal protective structure 5204 includes: a first extension portion 5204a and a second extension portion 5204b. The first extension portion 5204a and the second extension portion 5204b substantially extend along the first direction. One end of the first extension portion 5204a adjacent to the corner of the edge 110 of the display region is connected to the second extension part 5204b. The structure of the fourth metal protective block 5204 is similar to the structure of the fourth metal protective block 5201 in the foregoing embodiment, and thus will not be elaborated herein.

In at least one exemplary embodiment, as shown in FIG. 18 and FIG. 19, the fifth metal protective block 5205 extends along the first direction to the corner 120 of the second power supply line 220. The fifth metal protective structure 5205 is located on a side of the first isolation dam 410 away from the display region 100. The fourth metal protective block 5204 and the fifth metal protective block 5205 are disconnected at the corner 120 of the first isolation dam 410 and the second power supply 220. The fifth metal protective block 5205 and the first isolation dam 410 have an overlapping region, and an edge of the fifth metal protective block 5205 close to the display region 100 is located in the first isolation dam 410. A distance between an edge of the fifth metal protective block 5205 away from the display region 100 and the edge 110 of the display region is greater than a distance between an edge of the second isolation dam 420 away from the display region 100 and the edge 110 of the display region. A width of the fifth metal protective block 5205 is greater than the sum of a distance between the first isolation dam 410 and the second isolation dam 420 and a width of the second isolation dam 420.

In at least one exemplary embodiment, as shown in FIG. 18 to FIG. 20, in a plane perpendicular to the display substrate, the first fanout area in the first peripheral region 200 may include: a composite insulating layer arranged on the base substrate 10, the first power supply line 210 and the second power supply line 220 both arranged on the composite insulating layer, the organic insulating layer arranged on the first power supply line 210 and the second power supply line 220, the first metal protective structure 510, the second metal protective structure 520, the first isolation dam 410 and the second isolation dam 420 that are arranged on the organic insulating layer, and a first encapsulation layer 25 and a third encapsulation layer 27 that cover the above-mentioned structures. The composite insulating layer includes: a first insulating layer 11, a second insulating layer 12, a third insulating layer 13, and a fourth insulating layer 14 that are stacked on the base substrate 10. The first insulating layer 11 to the fourth insulating layer 14 are all inorganic insulating layers. The organic insulating layer arranged on the first power supply line 210 and the second power supply line 220 includes a first planarization layer 15 and a second planarization layer 17. The first planarization layer 15 is a first organic insulating layer of this embodiment, and the second planarization layer 17 is a second organic insulating layer of this embodiment. The first planarization layer 15 includes two adjacent organic grooves in the first peripheral region 200, and the second isolation dam 420 is arranged between the two organic grooves. The second planarization layer 17 includes three organic grooves in the first peripheral region 200, and the first isolation dam 410 and the second isolation dam 420 are respectively arranged between two adjacent organic grooves. The second planarization layer 17 covers edges of the first metal protective structure 510 and the second metal protective structure 520. The first metal protective structure 510 covers the first power supply line 210 exposed by the organic grooves of the organic insulating layer, and the second metal protective structure 520 covers the second power supply line 220 exposed by the organic grooves of the organic insulating layer. The first power supply line 210 and orthographic projections of the organic grooves of the first planarization layer 15 and the second planarization layer 17 on the base substrate 10 have a first overlapping region 710. The first metal protective structure 510 covers at least one edge of the first overlapping region 710 of the first power supply line 210 that is intersected with the first direction, for example, the side edge 2103. The second power supply line 220 and orthographic projections of the organic grooves of the first planarization layer 15 and the second planarization layer 17 on the base substrate 10 have a second overlapping region 720. The second metal protective structure 520 covers at least one edge of the second overlapping region 720 of the second power supply line 220 that is intersected with the first direction, for example, the side edge 2203. The first metal protective block 510 and the second metal protective block 520 are disconnected in the first isolation dam 410, and are respectively continuous in the second isolation dam 420. As shown in FIG. 20, the first metal protective block 5104 and the second metal protective block 5105 are disconnected in the first isolation dam 410, and the second metal protective block 5105 is continuous in the second isolation dam 420.

Structures of the display region 100 and the first peripheral region 200 in the exemplary embodiment are similar to the corresponding structures described in the abovementioned embodiment, and thus will not be elaborated herein.

The structure (or method) shown in the present implementation may be combined with structures (or methods) shown in other implementations as appropriate.

Figure 21:
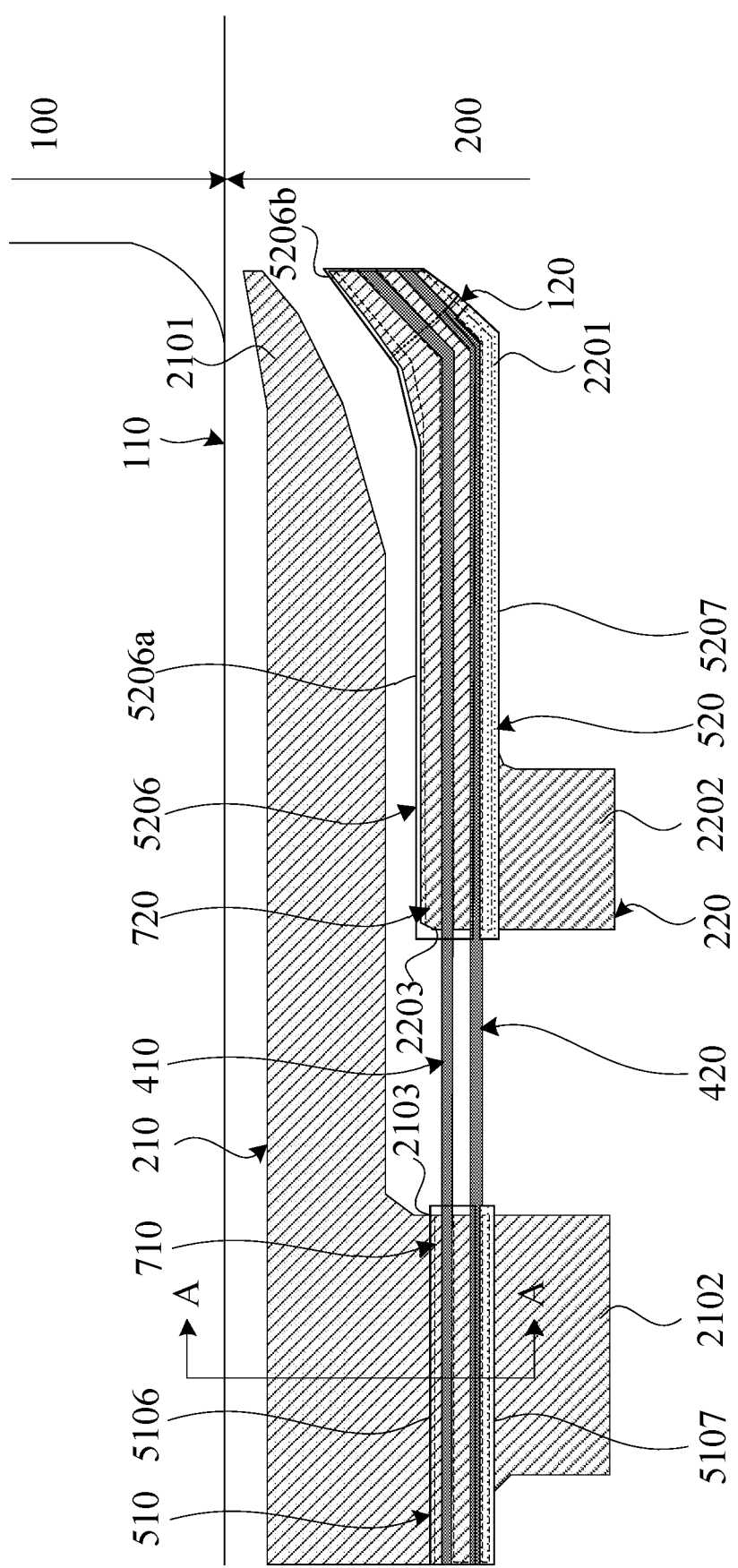
FIG. 21 is schematic diagram of another structure of a first fanout area according to at least one embodiment of the present disclosure.
Figure 22:
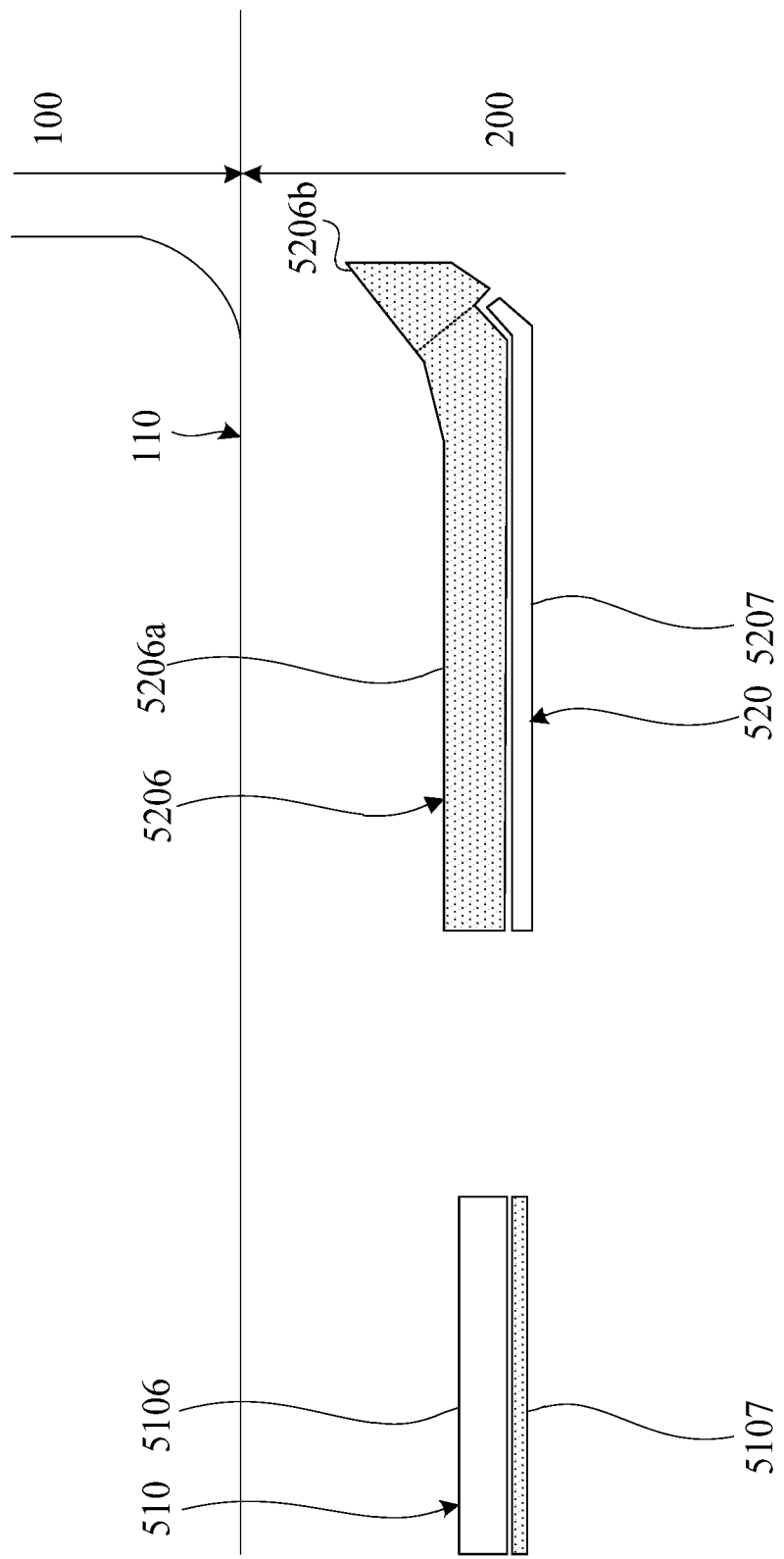
FIG. 22 is a top view of a metal protective structure in FIG. 21.
Figure 23:
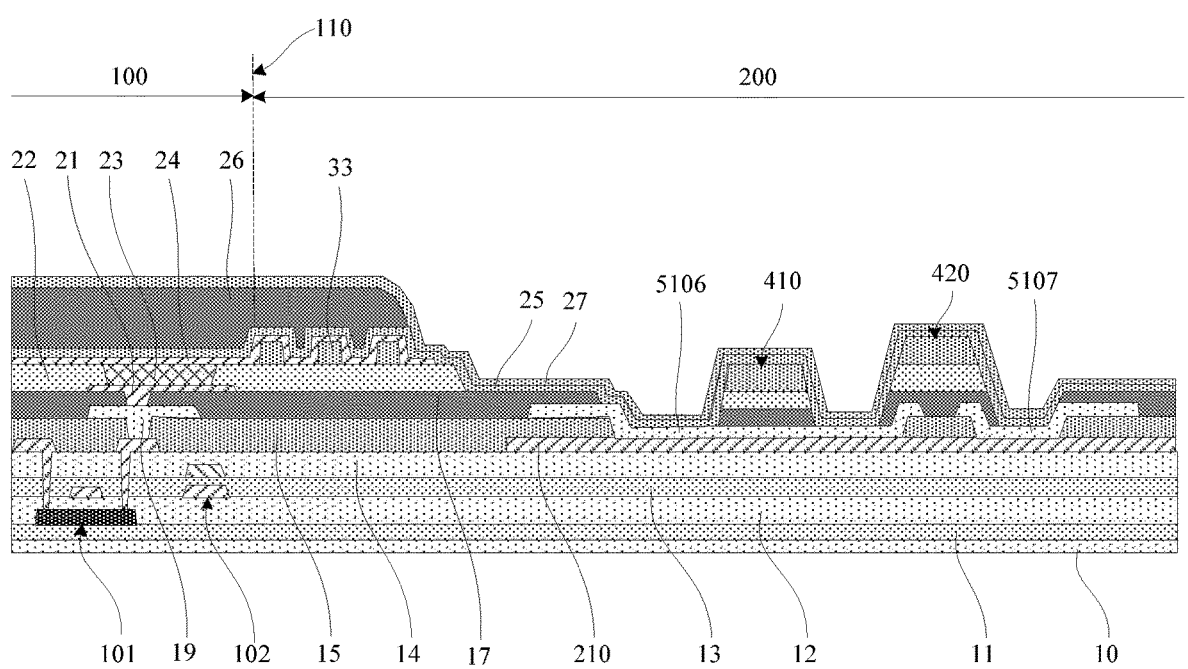
FIG. 23 is a schematic sectional view along a direction A-A in FIG. 21.

FIG. 21 is schematic diagram of another structure of a first fanout area according to at least one embodiment of the present disclosure, which is an enlarged view of a region C in FIG. 2. FIG. 22 is a top view of a metal protective structure in FIG. 21. FIG. 23 is a schematic sectional view along a direction A-A in FIG. 21. As shown in FIG. 21 and FIG. 22, in a plane parallel to the display substrate, the first peripheral region 200 is located between the display region 100 and the bonding region. The first metal protective structure 510 in the first peripheral region 200 is disconnected in the second isolation dam 420, and the second metal protective structure 520 is disconnected at the corner 120 of the second isolation dam 420 and the second power line 220. The first metal protective structure 510 includes: a first metal protective block 5106, and a second metal protective block 5107. The second metal protective structure 520 includes: a fourth metal protective block 5206 and a fifth metal protective block 5207.

In at least one exemplary embodiment, as shown in FIG. 21, FIG. 22 and FIG. 23, the first metal protective structure 5106 is located on a side of the second isolation dam 420 close to the display region 100. The first metal protective block 5106 and the second metal protective block 5107 are disconnected in the second isolation dam 420. Both the first metal protective block 5106 and the second metal protective block 5107 are overlapped with the first isolation dam 410, and there is an interval between adjacent edges of the first metal protective block 5106 and the second metal protective block 5107. An edge of the first metal protective block 5106 away from the display region 100 is located in the second isolation dam 420. An edge of the second metal protective block 5107 close to the display region 100 is located in the second isolation dam 420. A width of the first metal protective block 5106 is greater than the sum of a distance between the first isolation dam 410 and the second isolation dam 420 and a width of the first isolation dam 410. The first metal protective block 5106 is continuous in the first isolation dam 410. The first metal protective block 5106 and the second metal protective block 5107 are disconnected in the second isolation dam 420.

In at least one exemplary embodiment, as shown in FIG. 21 and FIG. 22, the fourth metal protective structure 5206 includes: a first extension portion 5206a and a second extension portion 5206b. An edge of the first extension portion 5206a away from the display region 100 is located in the second isolation dam 420, and the first extension portion 5206a is continuous in the first isolation dam 410. The second extension portion 5206b is continuous in both the first isolation dam 410 and the second isolation dam 420. The fifth metal protective block 5207 and the first extension portion 5206a of the fourth metal protective block 5206 are disconnected in the second isolation dam 420, and the second extension portion 5206b of the fourth metal protective block 5206 is disconnected at the corner 120 of the second power supply line 220.

Structures of the display region 100 and the first peripheral region 200 in the exemplary embodiment are similar to the corresponding structures described in the abovementioned embodiment, and thus will not be elaborated herein.

The structure (or method) shown in the present implementation may be combined with structures (or methods) shown in other implementations as appropriate.

Figure 24:
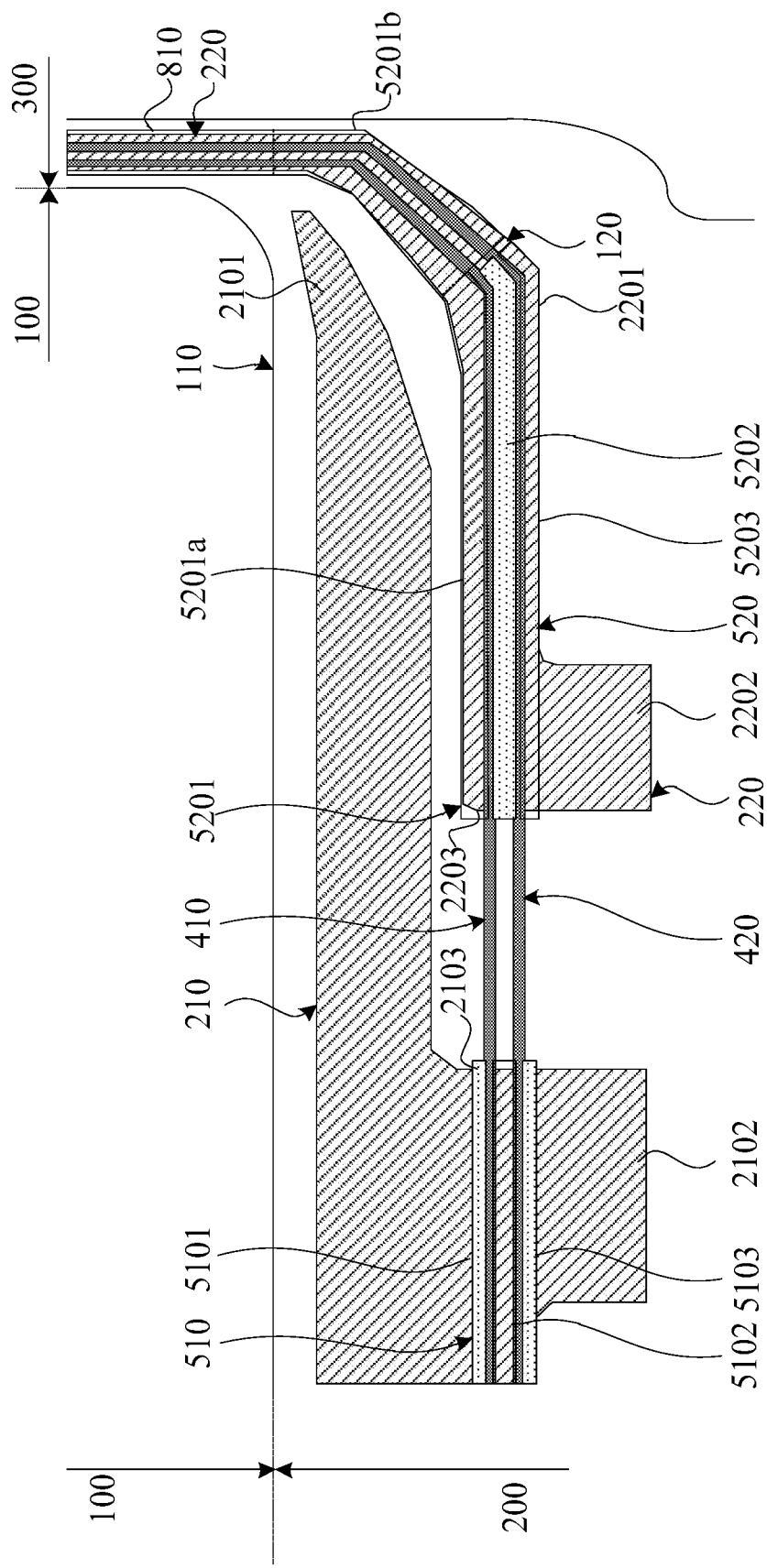
FIG. 24 is a schematic diagram of yet another structure of a first fanout area according to at least one embodiment of the present disclosure.

FIG. 24 is a schematic diagram of yet another structure of a first fanout area according to at least one embodiment of the present disclosure. As shown in FIG. 24, in a plane parallel to the display substrate, the first peripheral region 200 is located on a side of the display region 100 close to the bonding region, and the second peripheral region 300 is located on a side of the display region 100 away from the bonding region. The first peripheral region 200 and second peripheral region 300 are communicated to surround the display region 100. The first isolation dam 410 and the second isolation dam 420 in the first peripheral region 200 and the first isolation dam 410 and the second isolation dam 420 in the second peripheral region 300 are arranged in the same layer and simultaneously prepared by the same patterning process. The first isolation dam 410 in the first peripheral region 200 and the first isolation dam 410 in the second peripheral region 300 are of integrated structure, and form an annular structure surrounding the display region 100. The second isolation dam 420 in the first peripheral region 200 and the second isolation dam 420 in the second peripheral region 300 are of integrated structure, and form an annular structure surrounding the display region 100.

In at least one exemplary embodiment, as shown in FIG. 24, the second power supply line 220 extends from the first peripheral region 200 to the second peripheral region 300. The second power supply line 220 in the first peripheral region 200 and the second power supply line 220 in the second peripheral region 300 are arranged in the same layer and are prepared simultaneously by the same patterning process. The second peripheral region 300 includes a power supply connection line 810 arranged on a side of the second power supply line 220 away from the base substrate. The second power supply line 220 in the second peripheral region 300 is electrically connected to the display units in the display region 100 through the power supply connection line 810.

In at least one exemplary embodiment, as shown in FIG. 24, the second metal protective structure 520 in the first peripheral region 200 includes: a fourth metal protective block 5201, a fifth metal protective block 5202, and a sixth metal protective block 5203. The fourth metal protective block 5201, the fifth metal protective block 5202 and the sixth metal protective block 5203 are arranged in the same layer and spaced apart. The fourth metal protective block 5201 includes: a first extension portion 5201a and a second extension portion 5201b. The first extension portion 5201a and the second extension portion 5201b substantially extend along the first direction. One end of the first extension portion 5201a adjacent to the corner of the edge 110 of the display region may be connected to the second extension part 5201b. In a vertical direction of the first direction, an average width of the first extension portion 5201a is less than an average width of the second extension portion 5201b. The first extension portion 5201a is located on a side of the first isolation dam 410 close to the display region 100. The fifth metal protective block 5202 extends along the first direction to the corner 120 of the second power supply line 220. The fifth metal protective block 5202 is located between the first isolation dam 410 and the second isolation dam 420. The fifth metal protective block 5202 and the first extension portion 5201a of the fourth metal protective block 5201 are disconnected in the first isolation dam 410, and the fifth metal protective block 5202 and the second extension portion 5201b of the fourth metal protective block 5201 are disconnected at the corner 120 of the second power supply line 220. The sixth metal protective block 5203 extends along the first direction to the corner 120 of the second power supply line 220. The sixth metal protective block 5203 is located on a side of the second isolation dam 420 away from the display region 100. The sixth metal protective block 5203 and the fifth metal protective block 5202 are disconnected in the second isolation dam 420, and the sixth metal protective block 5203 and the second extension portion 5201b of the fourth metal protective block 5201 are disconnected at the corner 120 of the second power supply line 220.

In at least one exemplary embodiment, as shown in FIG. 24, the second metal protective structure 520 and the power connection line 810 of the second peripheral region 300 are arranged in the same layer, and are simultaneously prepared by the same patterning process. The fourth metal protective block 5201 of the second metal protective structure 520 is integrated with the power supply connection line 810. The second extension portion 5201b of the fourth metal protective block 5201 is connected to the power connection line 810.

Structures of the display region 100 and the first peripheral region 200 in the exemplary embodiment are similar to the corresponding structures described in the abovementioned embodiment, and thus will not be elaborated herein.

The structure (or method) shown in the present implementation may be combined with structures (or methods) shown in other implementations as appropriate.

At least one embodiment of the present disclosure further provides a method for preparing a display substrate, including: providing an base substrate, the base substrate including a display region, a bonding region located on a side of the display region, and a first peripheral region located between the display region and the bonding region; forming a power supply line in the first peripheral region, the power supply line being electrically connected to a display unit of the display region; and forming an organic insulating layer and a metal protective structure on a side of the power supply line away from the base substrate. The organic insulating layer includes, in the first peripheral region, at least two organic grooves and an isolation dam arranged between two adjacent organic grooves, the organic grooves penetrating the organic insulating layer. The power supply line and orthographic projections of the organic grooves on the base substrate have an overlapping region. The metal protective structure covers at least one edge of the overlapping region of the power supply line that is intersected with a first direction, the first direction referring to an extension direction parallel to an edge on a side of the display region close to the first peripheral region.

In some exemplary implementations, the above method may further include: forming a source-drain electrode layer of the driving structure layer in the display region while forming the power supply line in the first peripheral region; and forming, in the display region, a metal conductive layer that connects the source-drain electrode layer and a light emitting element while forming the metal protective structure in the first peripheral region.

In some exemplary implementations, forming the organic insulating layer and the metal protective structure on the side of the power supply line away from the base substrate includes: forming a first organic insulating layer on a side of the power supply line away from the base substrate; forming a metal protective structure on a side of the first organic insulating layer away from the base substrate; and forming a second organic insulating layer on a side of the metal protective structure away from the base substrate, the second organic insulating layer covering the edge of the metal protective structure.

The method of this embodiment may refer to the description of the foregoing embodiments, and thus will not be elaborated herein.

Figure 25:
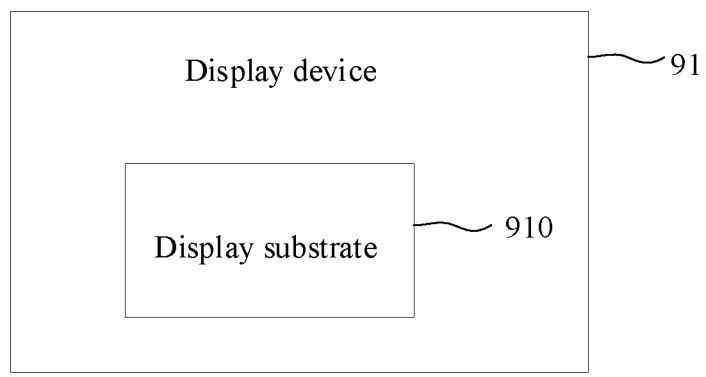
FIG. 25 is a schematic diagram of a display device according to at least one embodiment of the present disclosure.

FIG. 25 is a schematic diagram of a display device according to at least one embodiment of the present disclosure. As shown in FIG. 25, the present embodiment provides a display device 91, which includes a display substrate 910. The display substrate 910 is the display substrate provided in the foregoing embodiments. The display substrate 910 may be an OLED display substrate. The display device 91 may be any product or component with a display function, such as an OLED display device, a mobile phone, a tablet computer, a television, a display, a notebook computer, a digital photo frame, and a navigator. However, no limits are made thereto in the present embodiment.

The accompanying drawings in the present disclosure only relate to the structures related to the present disclosure, and other structures may refer to general designs. The embodiments in the present disclosure, i.e., the features in the embodiments, can be combined if there are no conflicts to obtain new embodiments. Those of ordinary skill in the art should understand that modification or equivalent replacement may be made to the technical solutions of the present disclosure without departing from the spirit and scope of the technical solutions of the present disclosure, and should all fall within the scope of the claims of the present disclosure.

The invention claimed is:

1. A display substrate, comprising:
   a base substrate, comprising a display region, a bonding region located on a side of the display region, and a first peripheral region located between the display region and the bonding region; the display region comprising a plurality of display units;
   a power supply line, at least partially arranged in the first peripheral region of the base substrate, and electrically connected to the display units;
   an organic insulating layer, arranged on a side of the power supply line away from the base substrate, the organic insulating layer comprising, in the first peripheral region, at least two organic grooves and an isolation dam arranged between adjacent two organic grooves, the organic grooves penetrating the organic insulating layer; wherein there is an overlapping region between the power supply line and orthographic projections of the organic grooves on the base substrate; and
   a metal protective structure, arranged on a side of the power supply line away from the base substrate, and covering at least one edge of the overlapping region of the power supply line that is intersected with a first direction, the first direction referring to an extension direction parallel to an edge on a side of the display region close to the first peripheral region, wherein:
   the isolation dam comprises a first isolation dam and a second isolation dam, a distance between the first isolation dam and an edge on a side of the display region close to the first peripheral region is less than a distance between the second isolation dam and an edge on a side of the display region close to the first peripheral region;
   the metal protective structure is disconnected in the first isolation dam, or the metal protective structure is disconnected in the second isolation dam, or the metal protective structure is disconnected in both the first isolation dam and the second isolation dam;
   the power supply line comprises a first power supply line and a second power supply line; the first power supply line and orthographic projections of the organic grooves on the base substrate have a first overlapping region; and the second power supply line and the orthographic projections of the organic grooves on the base substrate have a second overlapping region;
   the metal protective structure comprises: a first metal protective structure and a second metal protective structure;

the first metal protective structure covers at least one edge of the first overlapping region of the first power supply line that is intersected with the first direction; the second metal protective structure covers at least one edge of the second overlapping region of the second power supply line that is intersected with the first direction;

the first metal protective structure is disconnected in the first isolation dam, or is disconnected in the second isolation dam, or is disconnected in both the first isolation dam and the second isolation dam; and the second metal protective structure is disconnected in the first isolation dam, or is disconnected in the second isolation dam, or is disconnected in both the first isolation dam and the second isolation dam.

2. The display substrate according to claim 1, wherein the metal protective structure is in direct contact with the overlapping region of the power supply line and covers the edge of the overlapping region of the power supply line that is intersected with the first direction.

3. The display substrate according to claim 1, wherein an orthogonal projection of the metal protective structure on the base substrate covers an orthogonal projection of the overlapping region on the base substrate, and the metal protective structure is disconnected in the isolation dam.

4. The display substrate according to claim 1, wherein the first power supply line comprises: a first strip portion and a second strip portion, the first strip portion extending along the first direction, the second strip portion extending in a direction away from the display region, and an end of the second strip portion adjacent to the display region being connected to the first strip portion; and the first isolation dam, the second isolation dam, and the first metal protective structure are all arranged on a side of the second strip portion away from the base substrate.

5. The display substrate according to claim 1, wherein the first metal protective structure comprises: a first metal protective block, a second metal protective block, and a third metal protective block sequentially arranged along a direction away from the display region;

the first metal protective block is located on a side of the first isolation dam close to the display region, the second metal protective block is located between the first isolation dam and the second isolation dam, and the third metal protective block is located on a side of the second isolation dam away from the display region; and both the first metal protective block and the second metal protective block are overlapped with the first isolation dam, and there is an interval between adjacent edges of the first metal protective block and the second metal protective block; both the second metal protective block and the third metal protective block are overlapped with the second isolation dam, and there is an interval between adjacent edges of the second metal protective block and the third metal protective block.

6. The display substrate according to claim 1, wherein the first metal protective structure comprises: a first metal protective block and a second metal protective block sequentially arranged along a direction away from the display region;

wherein the first metal protective block is located on a side of the first isolation dam close to the display region, and the second metal protective block is located on a side of the first isolation dam away from the display region; both the first metal protective block and the second metal protective block are overlapped with the first isolation dam, and there is an interval between adjacent edges of the first metal protective block and the second metal protective block;

or, the first metal protective block is located on a side of the second isolation dam close to the display region, and the second metal protective block is located on a side of the second isolation dam away from the display region; both the first metal protective block and the second isolation dam are overlapped with the second isolation dam, and there is an interval between adjacent edges of the first metal protective block and the second metal protective block.

7. The display substrate according to claim 1, wherein the base substrate further comprises: a second peripheral region located on a periphery of the display region and on a side away from the bonding region, the first peripheral region and the second peripheral region are communicated to surround the display region;

the second power supply line extends from the first peripheral region to the second peripheral region, the second peripheral region contains a power supply connection line arranged on a side of the second power supply line away from the base substrate, and the second power supply line in the second peripheral region is electrically connected to the display units in the display region through the power supply connection line; and the second metal protective structure and the power supply connection line are arranged in a same layer and spaced apart, or the second metal protective structure comprises at least two metal protective blocks, wherein one metal protective block is integrated with the power supply connection line, and is arranged in a same layer as a rest of the metal protective blocks and spaced apart from the rest of the metal protective blocks.

8. The display substrate according to claim 1, wherein the second power supply line in the first peripheral region comprises: a third strip portion and a fourth strip portion, the third strip portion substantially extends along the first direction, and the third strip portion has a corner; the fourth strip portion extends in a direction away from the display region, and an end of the fourth strip portion adjacent to the display region is connected to the third strip portion; and the first isolation dam, the second isolation dam, and the second metal protective structure are all arranged on a side of the third strip portion away from the base substrate.

9. The display substrate according to claim 8, wherein the second metal protective structure comprises: a fourth metal protective block, a fifth metal protective block and a sixth metal protective block sequentially arranged along a direction away from the display region;

the fourth metal protective block is located on a side of the first isolation dam close to the display region, and comprises a first extension portion and a second extension portion; both the first extension portion and the second extension portion substantially extend along the first direction, and an end of the first extension portion close to the corner of the third strip portion of the second power supply line is connected to the second extension portion; in a vertical direction of the first direction, an average width of the first extension portion is less than an average width of the second extension portion;

the fifth metal protective block and the first extension portion of the fourth metal protective block are disconnected in the first isolation dam, and the fifth metal protective block and the second extension portion of the fourth metal protective block are disconnected at the corner of the third strip portion; and the sixth metal protective block and the fifth metal protective block are disconnected in the second isolation dam, and the sixth metal protective block and the second extension portion of the fourth metal protective block are disconnected at the corner of the third strip portion.

10. The display substrate according to claim 8, wherein the second metal protective structure comprises: a fourth metal protective block and a fifth metal protective block sequentially arranged along a direction away from the display region; the fourth metal protective block comprises a first extension portion and a second extension portion; both the first extension portion and the second extension portion substantially extend along the first direction, and an end of the first extension portion close to the corner of the third strip portion of the second power supply line is connected to the second extension portion; in a vertical direction of the first direction, an average width of the first extension portion is less than an average width of the second extension portion;

wherein the fourth metal protective block is located on a side of the first isolation dam close to the display region, the fifth metal protective block and the first extension portion of the fourth metal protective block are disconnected in the first isolation dam, and the fifth metal protective block and the second extension portion of the fourth metal protective block are disconnected at the corner of the third strip portion;

or, the fourth metal protective block is located on a side of the second isolation dam close to the display region, the fifth metal protective block and the first extension portion of the fourth metal protective block are disconnected in the second isolation dam, and the fifth metal protective block and the second extension portion of the fourth metal protective block are disconnected at the corner of the third strip portion.

11. The display substrate according to claim 1, wherein a distance between the edge of the overlapping region of the power supply line that is intersected with the first direction and covered with the metal protective structure and an edge of an adjacent metal protective structure ranges from 5 microns to 15 microns.

12. The display substrate according to claim 1, wherein the organic insulating layer comprises: a first organic insulating layer and a second organic insulating layer, the first organic insulating layer is arranged on a side of the power supply line away from the base substrate, the second organic insulating layer is arranged on a side of the metal protective structure away from the base substrate, and the second organic insulating layer covers an edge of the metal protective structure.

13. The display substrate according to claim 1, wherein the display region comprises: a driving structure layer, a metal conductive layer arranged on the driving structure layer, a light emitting element arranged on the metal conductive layer, and a composite encapsulation layer arranged on the light emitting element, the light emitting element being connected to the driving structure layer through the metal conductive layer;

the driving structure layer comprises: an active layer, a first gate metal layer, a second gate metal layer, and a source-drain electrode layer that are arranged on the base substrate and insulated from one another; and the power supply line and the source-drain electrode layer are arranged in a same layer, and the metal protective structure and the metal conductive layer are arranged in a same layer.

14. The display substrate according to claim 13, further comprising: a composite insulating layer arranged on a side of the power supply line close to the base substrate; the composite insulating layer comprising: a first insulating layer, a second insulating layer, a third insulating layer, and a fourth insulating layer, and the first insulating layer to the fourth insulating layer are all inorganic insulating layers.

15. A display device, comprising the display substrate according to claim 1.

16. A method for preparing a display substrate, comprising:

providing an base substrate, the base substrate comprising a display region, a bonding region located on a side of the display region, and a first peripheral region located between the display region and the bonding region;

forming a power supply line in the first peripheral region, the power supply line being electrically connected to a display unit of the display region; and forming an organic insulating layer and a metal protective structure on a side of the power supply line away from the base substrate, wherein the organic insulating layer comprises, in the first peripheral region, at least two organic grooves and an isolation dam arranged between adjacent two organic grooves, the organic grooves penetrate the organic insulating layer, there is an overlapping region between the power supply line and orthographic projections of the organic grooves on the base substrate, and the metal protective structure covers at least one edge of the overlapping region of the power supply line that is intersected with a first direction, the first direction referring to an extension direction parallel to an edge on a side of the display region close to the first peripheral region, wherein:

the isolation dam comprises a first isolation dam and a second isolation dam, a distance between the first isolation dam and an edge on a side of the display region close to the first peripheral region is less than a distance between the second isolation dam and an edge on a side of the display region close to the first peripheral region;

the metal protective structure is disconnected in the first isolation dam, or the metal protective structure is disconnected in the second isolation dam, or the metal protective structure is disconnected in both the first isolation dam and the second isolation dam;

the power supply line comprises a first power supply line and a second power supply line; the first power supply line and orthographic projections of the organic grooves on the base substrate have a first overlapping region; and the second power supply line and the orthographic projections of the organic grooves on the base substrate have a second overlapping region;

the metal protective structure comprises: a first metal protective structure and a second metal protective structure;

the first metal protective structure covers at least one edge of the first overlapping region of the first power supply line that is intersected with the first direction; the second metal protective structure covers at least one edge of the second overlapping region of the second power supply line that is intersected with the first direction;

the first metal protective structure is disconnected in the first isolation dam, or is disconnected in the second isolation dam, or is disconnected in both the first isolation dam and the second isolation dam; and the second metal protective structure is disconnected in the first isolation dam, or is disconnected in the second isolation dam, or is disconnected in both the first isolation dam and the second isolation dam.

17. The method according to claim 16, further comprising: forming a source-drain electrode layer of a driving structure layer in the display region while forming the power supply line in the first peripheral region; and forming, in the display region, a metal conductive layer that is connected with the source-drain electrode layer and a light emitting element while forming the metal protective structure in the first peripheral region.

18. The method according to claim 16, wherein forming the organic insulating layer and the metal protective structure on the side of the power supply line away from the base substrate comprises:

forming a first organic insulating layer on the side of the power supply line away from the base substrate;

forming the metal protective structure on a side of the first organic insulating layer away from the base substrate; and forming a second organic insulating layer on a side of the metal protective structure away from the base substrate, the second organic insulating layer covering an edge of the metal protective structure.

\* \* \* \* \*